(12) United States Patent
Takagiwa

(10) Patent No.: US 10,103,716 B2
(45) Date of Patent: Oct. 16, 2018

(54) DATA LATCH CIRCUIT

(71) Applicant: Toshiba Memory Corporation, Tokyo (JP)

(72) Inventor: Teruo Takagiwa, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/442,685

(22) Filed: Feb. 26, 2017

(65) Prior Publication Data

US 2018/0054190 A1  Feb. 22, 2018

(30) Foreign Application Priority Data

Aug. 19, 2016  (JP) ................. 2016-161068

(51) Int. Cl.
*G11C 7/10* (2006.01)
*H03K 3/356* (2006.01)
*G06F 13/40* (2006.01)

(52) U.S. Cl.
CPC ... *H03K 3/356113* (2013.01); *G06F 13/4022* (2013.01)

(58) Field of Classification Search
CPC ....... G11C 7/065; G11C 7/1039; G11C 7/106; G11C 7/1087; G11C 211/5642
See application file for complete search history.

(56) References Cited

U.S. PATENT DOCUMENTS

| | | | |
|---|---|---|---|
| 6,184,722 B1 | 2/2001 | Hayakawa | |
| 6,373,748 B2* | 4/2002 | Ikehashi | G11C 16/3468 365/185.22 |
| 8,514,636 B2* | 8/2013 | Kamata | G11C 11/5642 365/189.05 |
| 2007/0236985 A1* | 10/2007 | Edahiro | G11C 8/10 365/154 |
| 2008/0080243 A1* | 4/2008 | Edahiro | G11C 11/5642 365/185.11 |
| 2011/0141814 A1* | 6/2011 | Abiko | G11C 16/0483 365/185.17 |
| 2014/0211566 A1 | 7/2014 | Kono | |

FOREIGN PATENT DOCUMENTS

| | | |
|---|---|---|
| JP | S59-004316 A | 1/1984 |
| JP | S61-025321 A | 2/1986 |

* cited by examiner

*Primary Examiner* — Khamdan Alrobaie
(74) *Attorney, Agent, or Firm* — Patterson & Sheridan, LLP

(57) ABSTRACT

A data latch circuit includes a first inverter circuit having a first input terminal and a first output terminal, and connected between a first voltage source and a second voltage source, a second inverter circuit having a second input terminal electrically connected to the first output terminal and a second output terminal electrically connected to the first input terminal, and connected between the first voltage source and the second voltage source, a first transistor electrically connected between the first voltage source and the first inverter circuit, a second transistor electrically connected between the second voltage source and the first inverter circuit, a first switch circuit that controls an electrical connection between the first output terminal and a first bus, and a second switch circuit that controls an electrical connection between the first output terminal and a second bus.

22 Claims, 17 Drawing Sheets

DATA LATCH CIRCUIT

CROSS-REFERENCE TO RELATED APPLICATION

This application is based upon and claims the benefit of priority from Japanese Patent Application No. 2016-161068, filed Aug. 19, 2016, the entire contents of which are incorporated herein by reference.

FIELD

Embodiments described herein relate generally to a data latch circuit.

BACKGROUND

The data latch is used in various devices.

DETAILED DESCRIPTION

Figure 1:
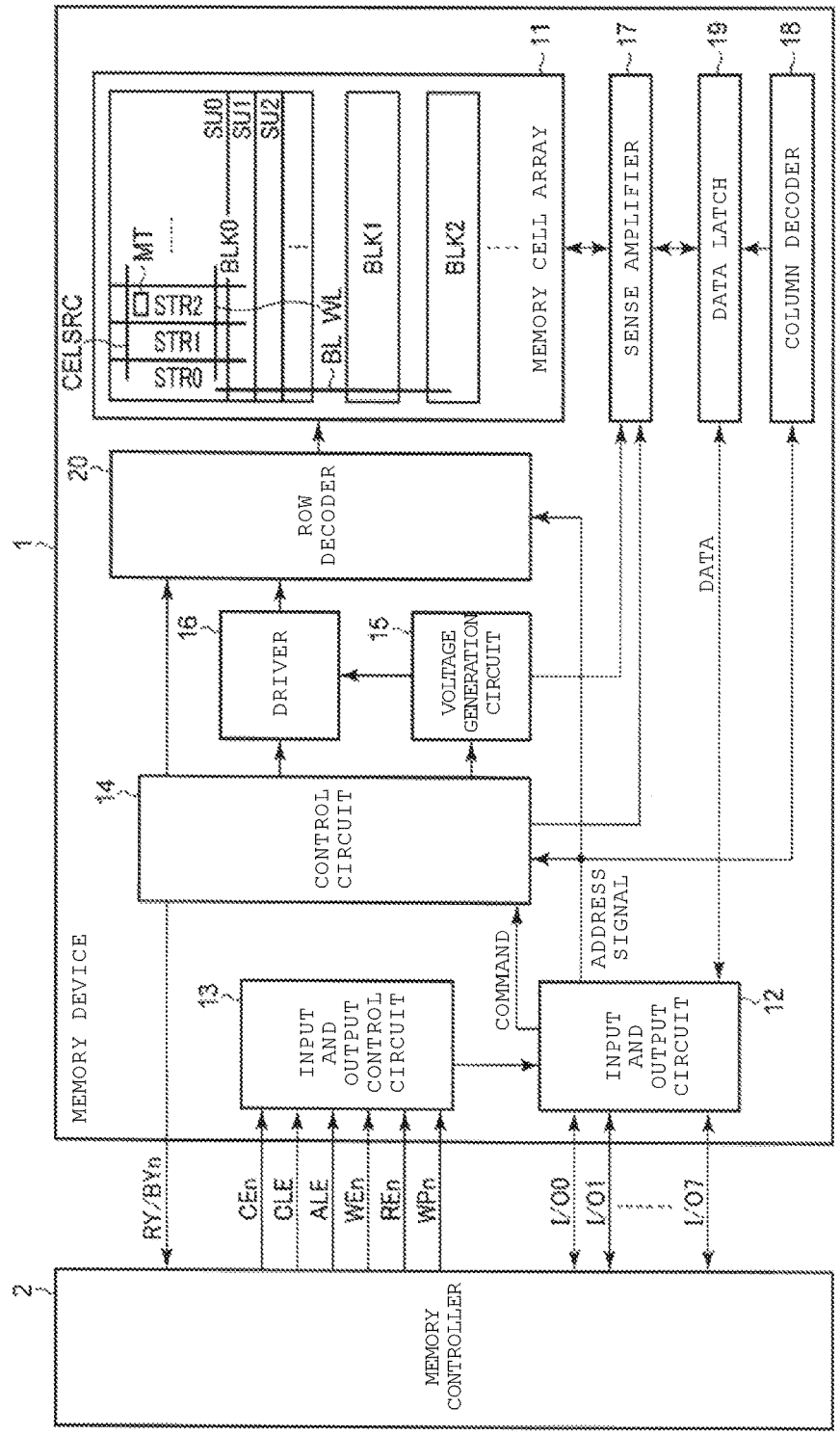
FIG. 1 is a functional block diagram illustrating a semiconductor memory device having a data latch circuit according to a first embodiment.

Embodiments provide a data latch circuit having a configuration that requires less number of transistors and thus can achieve a smaller circuit size.

In general, according to one embodiment, a data latch circuit includes a first inverter circuit having a first input terminal and a first output terminal, and connected between a first voltage source and a second voltage source, a second inverter circuit having a second input terminal electrically connected to the first output terminal and a second output terminal electrically connected to the first input terminal, and connected between the first voltage source and the second voltage source, a first transistor electrically connected between the first voltage source and the first inverter circuit, a second transistor electrically connected between the second voltage source and the first inverter circuit, a first switch circuit that controls an electrical connection between the first output terminal and a first bus, and a second switch circuit that controls an electrical connection between the first output terminal and a second bus.

Embodiments will be described below with reference to the drawings. In some cases, constituent elements that have substantially the same function and configuration are given the same reference numerals, and redundant descriptions are omitted. Unless otherwise explicitly or obviously excluded, all descriptions of a certain embodiment may also apply to other embodiments. Each embodiment illustrates a device or a method for realizing the technical idea behind the embodiments, and the technical idea behind the embodiments is not limited by a material, a shape, a structure, an arrangement, and the like of a constituent components of the embodiments.

"Connections" in the scope of the specification and of the claims include a direct connection and a connection through a conductive element.

First Embodiment 1.1 Configuration (Structure)

FIG. 1 is a functional block diagram illustrating a semiconductor memory device 1 according to a first embodiment. As illustrated in FIG. 1, a memory device 1 communicates with a memory controller 2, and operates according to commands issued by the memory controller 2.

The memory device 1 includes elements, such as a memory cell array 11, an input and output circuit 12, an input and output control circuit 13, a control circuit (e.g., a sequencer) 14, a voltage generation circuit 15, a driver 16, a sense amplifier 17, a column decoder 18, a data latch 19, and a row decoder 20.

The cell array 11 includes a plurality of memory blocks BLK (BLK0, BLK1, and so forth). The block BLK is a unit of data erasing, and data within each block BLK is erased collectively. However, data may be erased in a unit (for example, one-half block) that is smaller than one block BLK.

Each block BLK includes a plurality of multiple string units SU (SU0, SU1, and so forth). Each string unit SU includes a plurality of NAND strings STR (STR0, STR1, and so forth). The string STR includes cell transistors MT. Wirings, such as a word line WL, a bit line BL, a cell source line CELSRC, and selection gate lines SGDL and SGSL, are provided in the cell array 11.

The input and output circuit 12 transmits and receives signals I/O (I/O0 to I/O7) each of which has a certain bit width (for example, 8 bits), to and from the memory controller 2. The signal I/O may contain a command, write data or read data, an address signal, and the like. The write data is data that is transmitted from the memory controller 2 and is programmed in (i.e., written in) the cell transistor MT. The read data is data that read from the cell transistor MT and is transmitted to the memory controller 2. The input and output circuit 12 includes a total of 8 pads (not illustrated) for each of signal I/O0 to I/O7. Each of signal I/O0 to I/O7 is transmitted or received in one pad.

The input and output control circuit 13 receives various control signals from the memory controller 2, and based on the control signal, controls the input and output circuit 12. The control signals include CEn, CLE, ALE, WEn, REn, and WPn. The suffix n of the name of the signal means that the signal is asserted at a low level.

The signal CEn that is asserted enables the memory device 1. The signal CLE that is asserted notifies the memory device 1 that the signal I/O which flows through the memory device 1 along with the signal CLE that is asserted is a command. The signal ALE that is asserted notifies the memory device 1 that the signal I/O which flows through the memory device 1 along with the signal ALE that is asserted is an address signal. The address signal is a signal that includes an address. The signal WEn that is supported instructs the memory device 1 to take in the signal I/O that flows through the memory device 1 along with the signal WEn which is asserted as an input. The signal REn that is asserted instructs the memory device 1 to output the signal I/O. The signal WPn that is asserted instructs the memory device 1 that programming and erasing of data are prevented.

The control circuit 14 receives a command and an address signal from the input and output circuit 12, and, based on the command and the address signal, controls the voltage generation circuit 15, the driver 16, the sense amplifier 17, and the row decoder 20. The control circuit 14 outputs a signal RY/BYn. The signal RY/BYn indicates whether the memory device 1 is in a ready state or in a busy state, and indicates the busy state by a low level. The memory device 1 in the ready state receives a command from the outside. The memory device 1 in the busy state does not receive a command from the outside.

The voltage generation circuit 15 receives a power-supply power (a power-supply voltage that is not illustrated) from the outside of the memory device 1, and generates various voltages from the power-supply voltage. The generated voltages are supplied to elements, such as the driver 16 and the sense amplifier 17. The voltages that are generated by the voltage generation circuit 15, for example, include a voltage that is applied to the word line WL, the selection gate lines SGDL and SGSL, and the source line CELSRC. The driver 16 receives the voltages that are generated by the voltage generation circuit 15, and, according to control by the control circuit 14, supplies a voltage, which is selected from among the received voltages, to the row decoder 20.

The row decoder 20 receives various voltages from the driver 16 and receives an address signal from the input and output circuit 12. The row decoder 20 selects one block BLK based on the received address signal, and transfers the voltage from the driver 16 to the selected block BLK.

The sense amplifier 17 senses the read data from the cell transistor MT, and transfers the write data to the cell transistor MT.

The data latch 19 retains the write data from the input and output circuit 12 and supplies the write data to the sense amplifier 17. Furthermore, the data latch 19 receives the read data from the sense amplifier 17, and according to control by the column decoder 18, supplies the read data to the input and output circuit 12. The column decoder 18 controls the data latch 19 based on the address signal.

1.1.1 Cell Array

Figure 2:
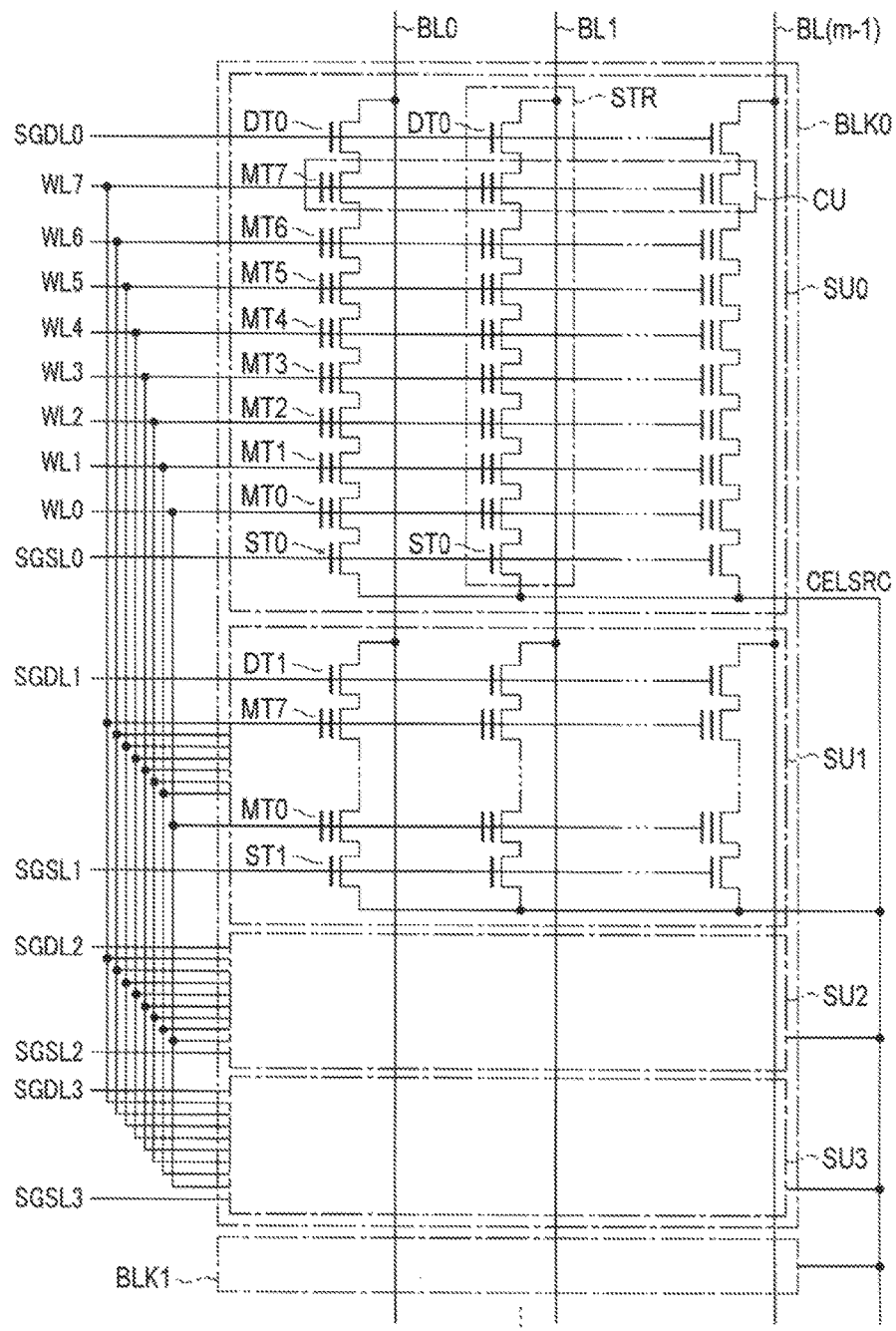
FIG. 2 is a circuit diagram of a cell array in the semiconductor memory device.

Next, a detailed example of the cell array 11 is described with reference to FIG. 2. FIG. 2 illustrates an example of some elements of the cell array 11 according to an embodiment and of connections therebetween. FIG. 2 illustrates the details of one block BLK0 and elements related thereto. A plurality of (for example, all) blocks BLK include the same elements that are all connected in the same manner.

Each block BLK includes the string units SU0 to SU3. Each of m (m is, a natural number, which is for example, 4096) bit lines BL0 to BLm−1 is connected to one string STR from each of four string units SU0 to SU3, in each block BLK.

Each string STR includes one selection gate transistor ST (ST0 to ST3), a plurality of (for example, eight) memory cell transistors MT0 to MT7, and one selection gate transistor DT (DT0 to DT3). The transistors ST, MT, and DT are connected in this order in series between the source line CELSRC and one bit line BL. The cell transistor MT includes a charge storage layer that is insulated from a control gate electrode (the word line WL) and from the vicinity thereof, and, based on an amount of voltage within the charge storage layer, can retain data in a nonvolatile state.

A set of strings STR, which are connected to a plurality of different bit lines BL in a one-to-one basis, constitutes one string unit SU. In each string unit SU, with regard to each $\alpha$ ($\alpha$ is any one of 0 and natural numbers that are equal to smaller than 7), a gate of a cell transistor MT$\alpha$ is connected to a word line WL$\alpha$. Additionally, in each block BLK, word lines WL$\alpha$ across different string units SU are connected to one another. A set of cell transistors MT that share the word line WL within the string unit SU is referred to as a cell unit CU.

With regard to each $\beta$ ($\beta$ is any one of 0 and natural numbers that are equal to or smaller than 3), transistors DT$\beta$ and ST$\beta$ belong to a string unit SU$\beta$.

With regard to each $\beta$, a gate of each transistor DT$\beta$ in a plurality of strings SIR in the string unit SU$\beta$ is connected to a selection gate line SGDL$\beta$. With regard to each $\beta$, a gate of each transistor ST$\beta$ in a plurality of strings SIR in the string unit SU$\beta$ is connected to a selection gate line SGSL$\beta$. Selection gate lines SGSL in a plurality of string units SU within one block BLK may be connected to one another.

1.1.2. Data Latch

Figure 3:
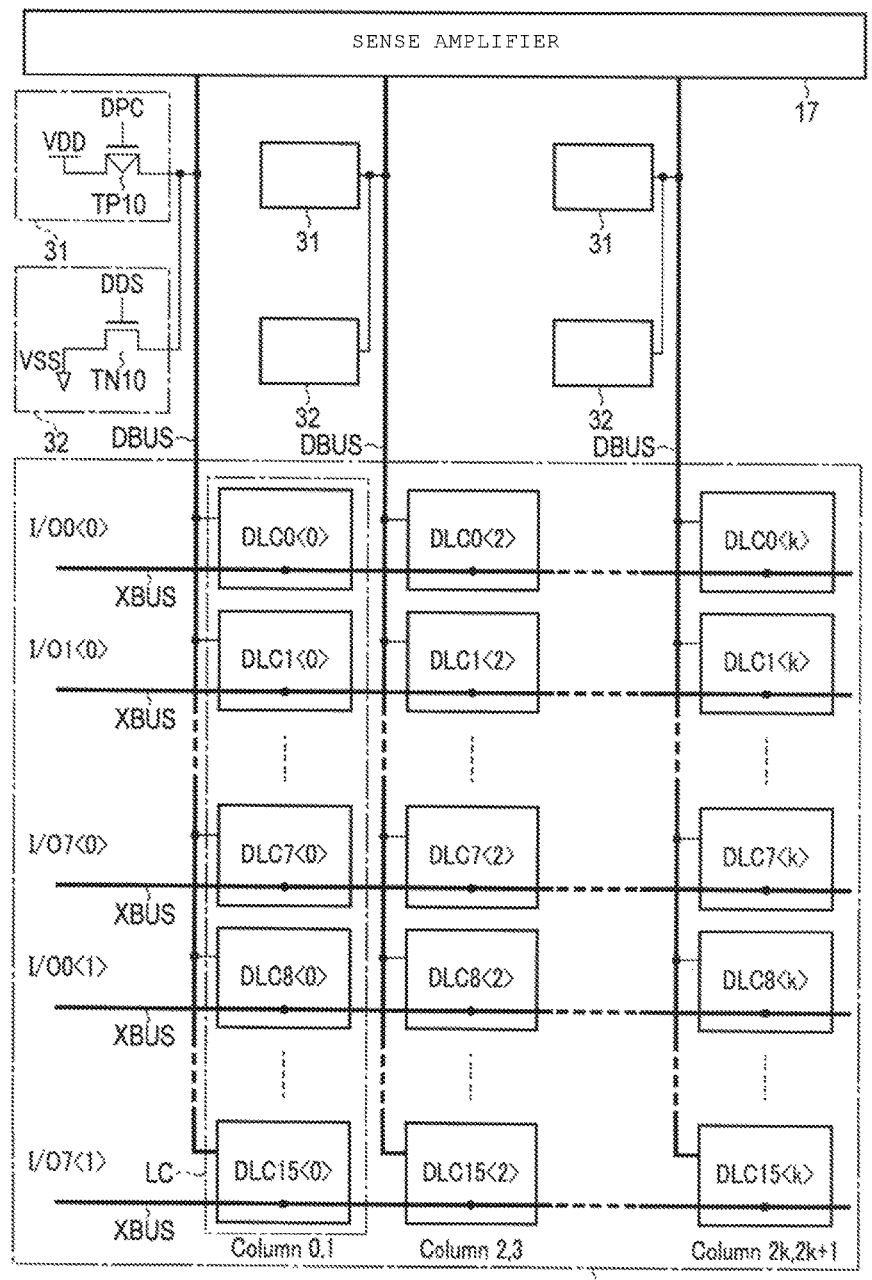
FIG. 3 is a diagram illustrating data latches employed in the semiconductor memory device.

The data latch 19 has elements and connections therebetween, which are illustrated in FIG. 3. FIG. 3 illustrates elements of the data latch 19 according to the first embodiment, related elements, and connections therebetween. As illustrated in FIG. 3, the data latch 19, for example, includes k (k is a natural number) data latch circuit columns LC. Each data latch circuit column LC includes a plurality of data latch circuits DLC. Each data latch circuit column LC, for example, includes a total of 16 latch circuits DLC0 to DLC15 that correspond to two columns. The following description is based on this example. With regard to each $\gamma$ ($\gamma$ is any one of 0 and natural numbers that are equal to or smaller than k), data latch circuits DLC0<$\gamma$> to DLC15<$\gamma$> are provided for column 2$\gamma$ and column 2$\gamma$+1.

The data latch 19 includes the data latch circuits DLC of which the number is the same as the number (for example, 4096) of bit lines BL. The data latch circuits DLC all have the same element and the same connection.

The data latch circuit DLC0 retains data that is transferred over a wiring I/O0 (I/O0<0>) for a first column. In the same manner, the data latch circuits DLC1 to DLC7 retain pieces of data that are transferred over wirings I/O1 to I/O7 (I/O1<0> to I/O7<0>), respectively, for the first column. In the same manner, the data latch circuits DLC8 to DLC15 retain pieces of data that are transferred over wirings I/O0 to I/O7 (I/O0<1> to I/O7<1>), respectively, for a second column. With regard to each $\varepsilon$ ($\varepsilon$ is any one of integers from 0 to 15), a set of data latch circuits DLC$\varepsilon$ retain as much data as can be contained within one page.

In the data latch circuit column LC, all data latch circuits DLC are connected to one another with one data bus DBUS. The data bus DBUS is additionally connected to the sense amplifier 17. The sense amplifier 17 includes a sense amplifier circuit and a data latch circuit therein, which are not illustrated.

Each data bus DBUS is additionally connected to a charging circuit 31 and a discharging circuit 32. The charging circuit 31 includes a p channel metal oxide semiconductor field effect transistor (MOSFET) TP10 between a data bus DBUS and a node (power-supply voltage node VDD) that supplies a power-supply voltage VDD. The power-supply voltage VDD, for example, is 1.8 V. The transistor TP10 receives a signal DPC from the control circuit 14 through a gate thereof. The discharging circuit 32 includes an n channel MOSFET TN10 between the data bus DBUS and a node (a ground voltage node VSS) that supplies a ground voltage VSS. The transistor TN10 receives a signal DDS from the control circuit 14 through a gate thereof.

A plurality of (for example, all) data latch circuits DLC0 (DLC0<0>, DLC0<2> within the data latch 19, and so forth up to DLC0<k>) are connected to one data bus XBUS. In the same manner, with regard to each ε (ε is any one of integers from 0 to 15), a plurality of (for example, all) data latch circuits DLCε within the data latch 19 are connected to one data bus XBUS. The data bus XBUS is connected to the input and output circuit 12 (refer to FIG. 1). That is, the data latch circuit DLC is a data latch circuit that is the closest to the input and output circuit 12, within the memory device 1, and is the first data latch circuit for a signal which is input to the memory device 1.

1.1.2.1 Data Latch Circuit

Figure 4:
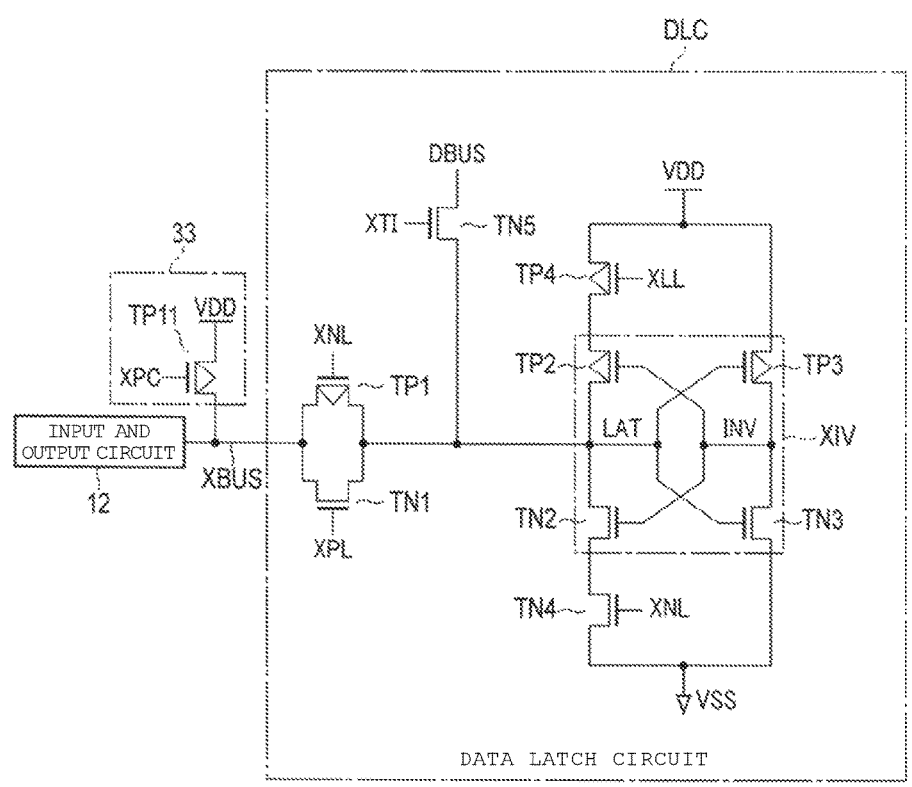
FIG. 4 is a circuit diagram of the data latch circuit according to the first embodiment.

Each data latch circuit DLC has elements and connections that are illustrated in FIG. 4. FIG. 4 illustrates elements of the data latch circuit DLC according to the first embodiment and connections therebetween.

As illustrated in FIG. 4, the data latch circuit DLC includes p channel MOSFETs TP1 to TP4 and n channel MOSFETs TN1 to TN5.

The transistors TP1 and TN1 are connected in parallel between the data bus XBUS and a node LAT, and constitute a switch circuit. The transistor TP1 receives a signal XNL from the control circuit 14 through a gate thereof. The transistor TN1 receives a signal XPL from the control circuit 14 through a gate thereof.

The data bus XBUS is additionally connected to a charging circuit 33. The charging circuit 33 includes a p channel MOSFET TP11 between the data bus XBUS and the power-supply voltage node VDD. The transistor TP11 receives a signal XPC from the control circuit 14 through a gate thereof.

Transistors TP2, TP3, TN2, and TN3 constitute a cross-connected inverter circuit XIV. That is, the transistors TP2 and TN2 constitute a first inverter circuit and are connected in series to each other in the node LAT, and gates thereof are connected to a node INV. The nodes LAT and INV function as an output and input, respectively, of the first inverter circuit. The transistors TP3 and TN3 constitute a second inverter circuit and are connected in series to each other in the node INV, and gates thereof are connected to the node LAT. The nodes LAT and INV function as an output and input, respectively, of the second inverter circuit.

One end of two ends of a current path of the transistor TP2, which is opposite in direction to the node LAT, is connected to the power-supply voltage node VDD through the transistor TP4. The transistor TP4 receives a signal XLL from the control circuit 14 through a gate thereof, and functions as the switch circuit.

One end of two ends of a current path of the transistor TP3, which is opposite in direction to the node INV, is connected to the power-supply voltage node VDD.

One end of two ends of a current path of the transistor TN2, which is opposite in direction to the node LAT, is connected to the ground voltage node VSS through the transistor TN4. The transistor TN4 receives the signal XNL from the control circuit 14 through a gate thereof, and functions as the switch circuit.

One end of two ends of a current path of the transistor TN3, which is opposite in direction to the node INV, is connected to the ground voltage node VSS.

The node LAT is additionally connected to one corresponding data bus DBUS through the transistor TN5. The transistor TN5 receives a signal XTI from the control circuit 14 through a gate thereof, and functions as the switch circuit.

The signals XTI and XNL are shared by a certain set of data latch circuits DLC, and the signals XLL and XPL are shared by a different set of data latch circuits DLC. This is described with reference to FIG. 5.

1.1.2.2 Arrangements of the Data Latch Circuits and Control Wirings

Figure 5:
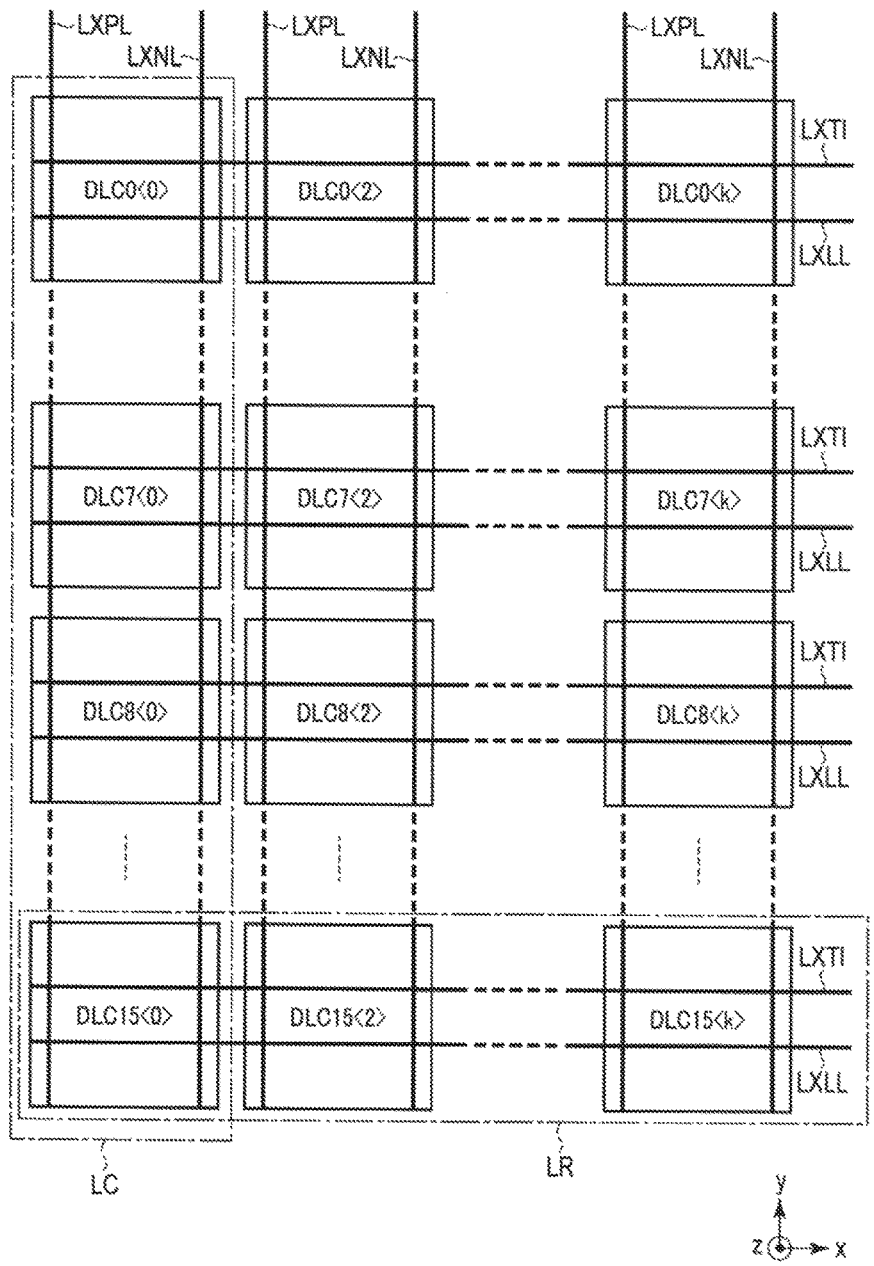
FIG. 5 is a diagram illustrating a layout of control signal wires for the data latch circuit according to the first embodiment.

FIG. 5 illustrates a layout of the data latch circuit DLC according to the first embodiment and an arrangement of wirings over which to transfer a signal for controlling the data latch circuit DLC. The x axis and the y axis intersect in FIG. 5. The x axis and the y axis constitute a xy plane, and the xy surface is along a surface of a semiconductor substrate on which the memory device 1 is formed. That is, the memory device 1 is formed on the surface of the semiconductor substrate. FIG. 5 illustrates a top view of the surface of the semiconductor substrate. The z axis intersects the xy plane. In FIG. 5, the data buses XBUS and DBUS that are illustrated in FIG. 3 are omitted.

As illustrated in FIG. 5, the data latch circuits DLC are arranged in a matrix configuration along the xy plane. That is, a plurality of data latch circuit columns LC line up alongside the x axis, and each data latch circuit column LC extends along the y axis. More specifically, the data latch circuits DLC0<0> to DLC15<0> line up alongside the y axis in order of increasing ε in DLCε<0>, in the first column among rows and columns of the data latch circuits DLC. In general, with regard to each γ, the data latch circuit DLCε<γ> line up alongside the γ axis in order of increasing ε. The data latch circuit column LC line up alongside the x axis in order of increasing γ.

Furthermore, the data latch circuit DLC0<γ>, that is, DLC0<0>, DLC0<2>, DLC0<4>, and so forth up to DLC0<k> line up in order of increasing γ in the first row among the rows and columns of the data latch circuits DLC. In general, with regard to each ε, the data latch circuits DLCε<0>, DLCε<2>, DLCε<4>, and so forth up to DLCε<k> line up alongside the x axis. As described above, ε is an integer that is 0 or is equal to or smaller than 15. Furthermore, a set of data latch circuits DLCε that are in the same row (that is, that have the same value ε) is referred to as a data latch circuit row LR, and extend alongside the y axis in order of increasing ε.

One wiring LXPL and one wiring LXNL are provided upward in the z axis direction for each data latch circuit column LC. The wirings LXPL and LXNL extend alongside the y axis. The signal XPL for the corresponding data latch circuit column LC is transferred over each wiring LXPL. Each wiring LXPL is connected to a gate of each of the transistors TN1 of each of the data latch circuits DLC in the corresponding data latch circuit column LC. The signal XNL for the corresponding data latch circuit column LC that is downward alongside the z axis of the wiring LXNL is transferred over each wiring LXNL. Each wiring LXNL is connected to a gate of each of the transistors TP1 of each of the data latch circuits DLC in the corresponding data latch circuit column LC. Each wiring LXNL is connected to a gate of each of the transistors TN4 of each of the data latch circuits DLC in the corresponding data latch circuit column LC. The wirings LXNL and LXPL are connected to the control circuit 14.

One wiring LXTI and one wiring LXLL are provided upward in the z axis direction of each data latch circuit row LR. The wirings LXTI and LXLL extend alongside the x axis. Each wiring LXTI is connected to a gate of each of the transistors TN5 of each of the data latch circuits DLC in the corresponding data latch circuit row LR. The signal XLL for the data latch circuit DLC in the corresponding data latch circuit row LR is transferred over each wiring LXLL. Each wiring LXLL is connected to a gate of each of the transistors TP4 of each of the data latch circuits DLC in the corresponding data latch circuit row LR. The wirings LXTI and LXLL are connected to the control circuit 14.

1.2 Operation

As described above, the data latch circuits DLC all have the same element and the connection, and thus based on the same combination of logics (levels) of the supplied signals XNL, XPL, XTI, and XLL, performs the same operation. An operation by one data latch circuit DLC will be described below.

Figure 6:
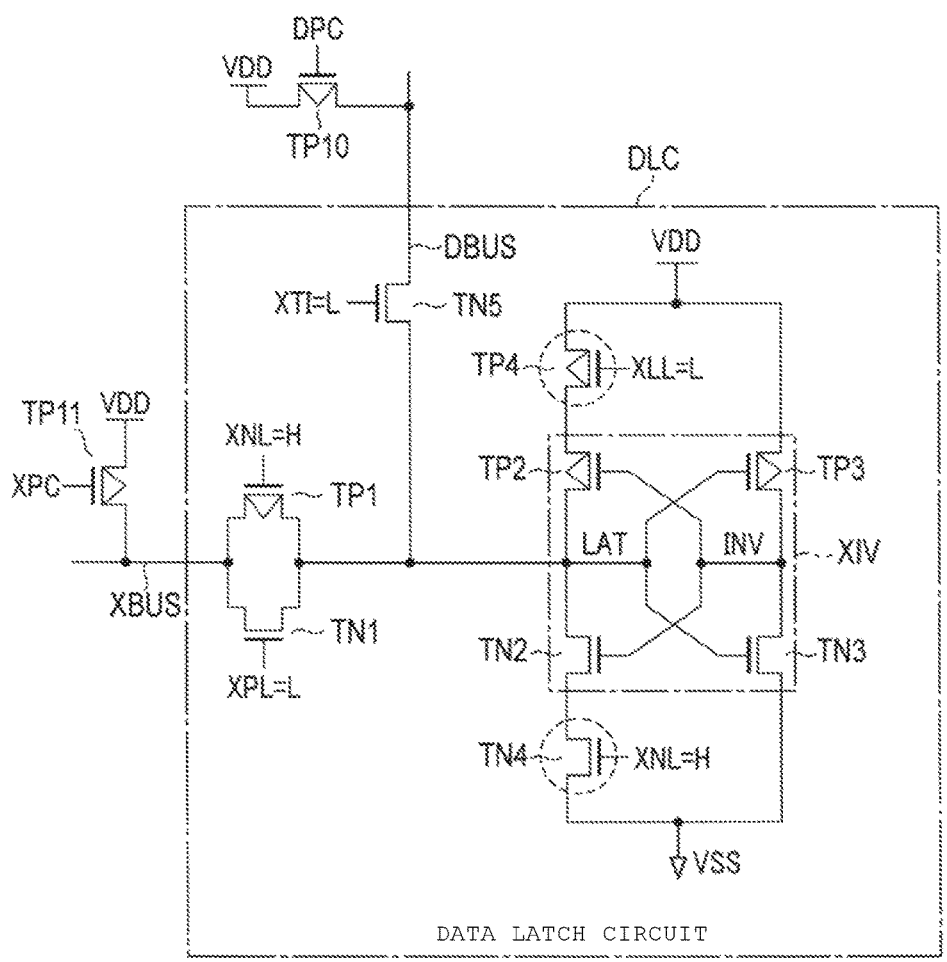
FIGS. 6-10 are circuit diagrams that illustrate different states of the data latch circuit according to the first embodiment during operation.
Figure 7:
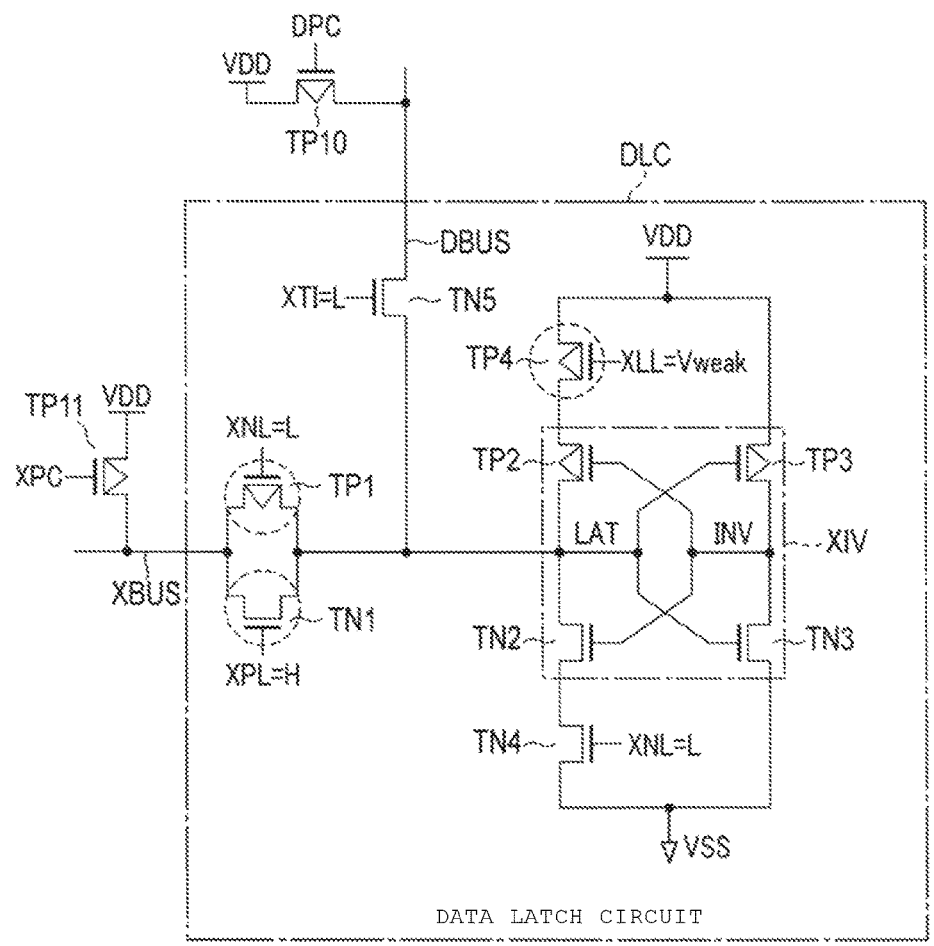
Figure 8:
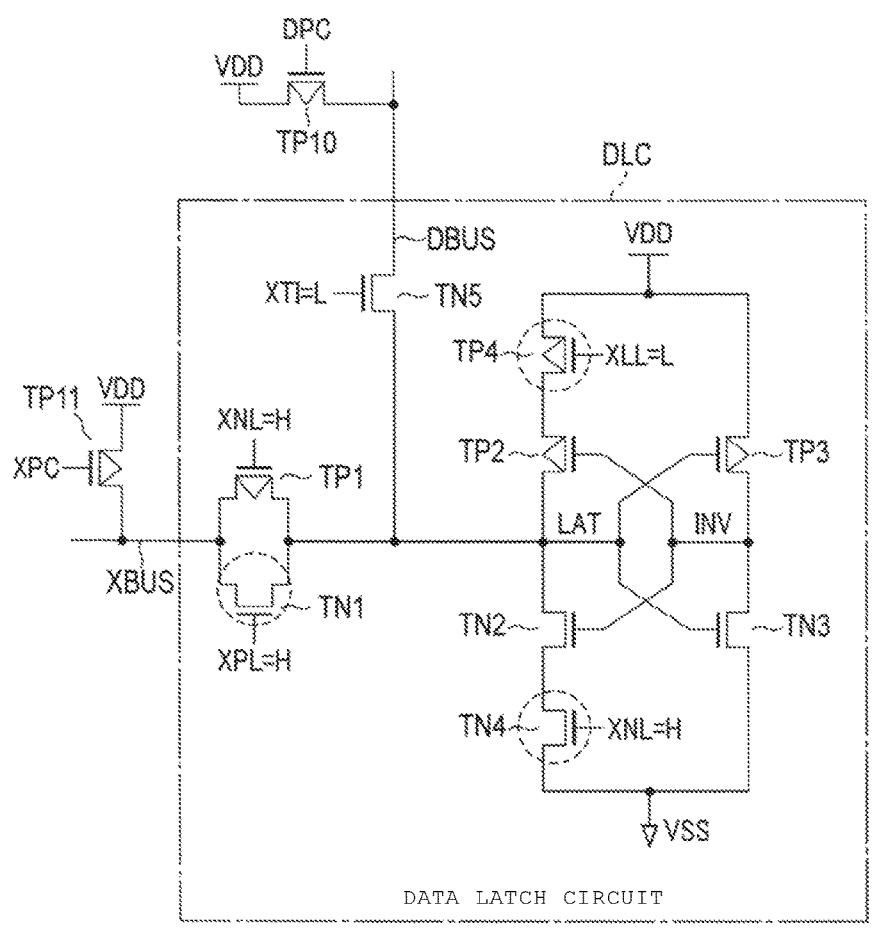
Figure 9:
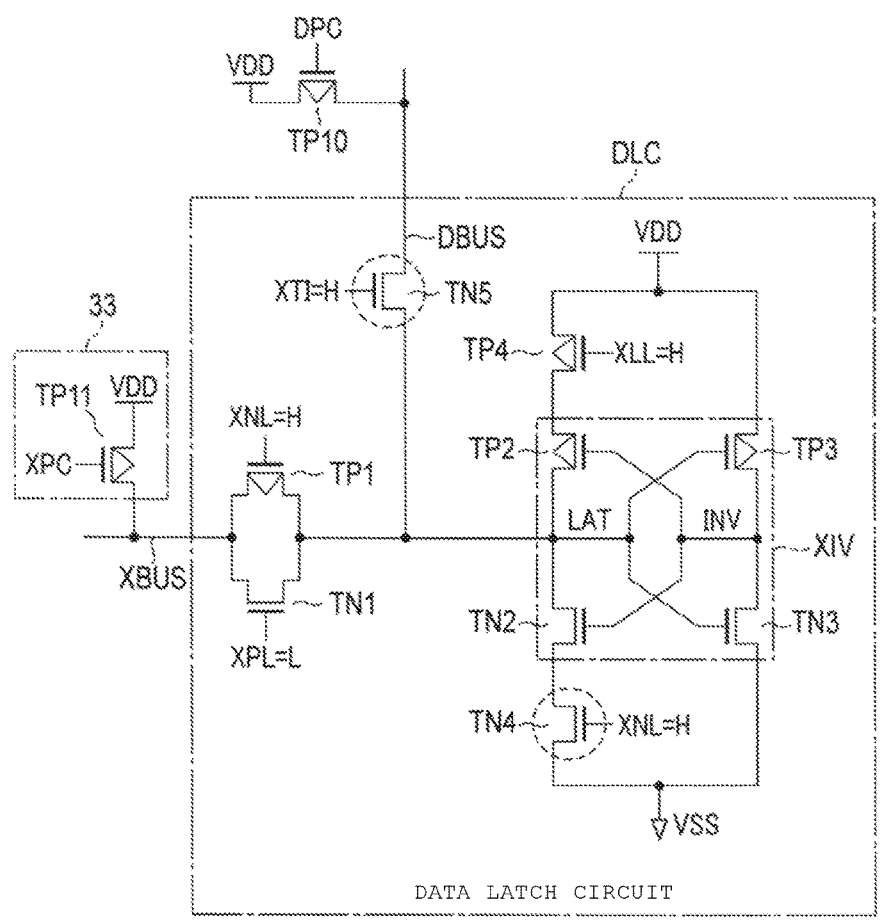
Figure 10:
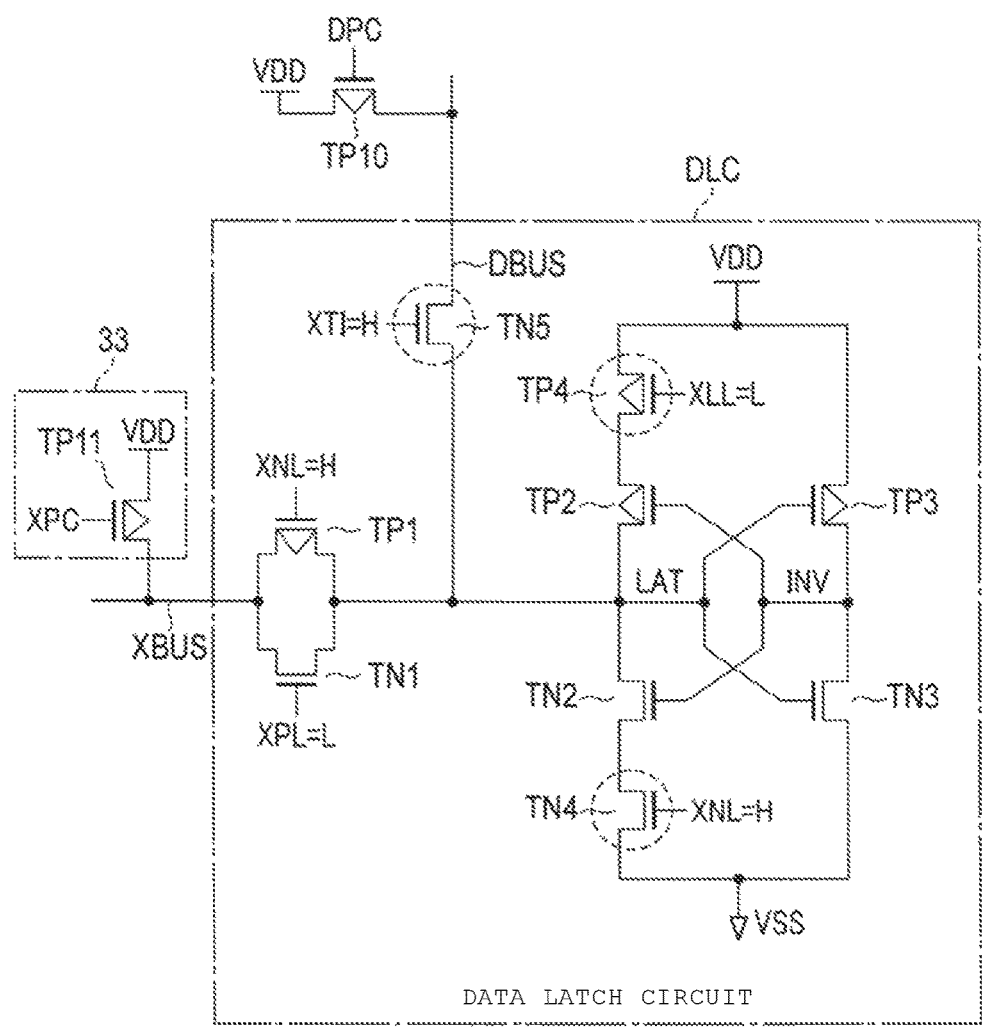

FIGS. 6 to 10 illustrate states of the transistors and the signals between various operations by one data latch circuit DLC, and illustrate the data buses XBUS and DBUS that are related to the data latch circuit DLC. FIG. 6 illustrates a state in which the data latch circuit DLC latches data. FIG. 7 illustrates a state in which data is input from the data bus XBUS into the data latch circuit DLC. FIG. 8 illustrates a state in which data is output from the data latch circuit DLC to the data bus XBUS. FIG. 9 illustrates a state in which data is input from the data bus DBUS to the data latch circuit DLC. FIG. 10 illustrates a state in which data is output from the data latch circuit DLC to the data bus DBUS. FIGS. 7 to 10 illustrate the data latch circuit DLC that is selected for operation. In some cases, such data latch circuit DLC is hereinafter referred to as a selected data latch circuit DLC. On the other hand, in some cases, the data latch circuit DLC which is not selected is referred to as a non-selected data latch circuit DLC. Additionally, in some cases, the data latch circuit row LR and the data latch circuit column LC that include the selected data latch circuit DLC are referred to as a selected data latch circuit row LR and a selected data latch circuit column LC, respectively. In some cases, the other data latch circuit rows LR and the other data latch circuit columns LC are referred to as non-selected data latch circuit rows LR and non-selected data latch circuit columns LC, respectively.

1.2.1 Data Latch

As illustrated in FIG. 6, for data latching by the selected data latch circuit DLC, while performing the data latching, the control circuit 14 maintains the signals XPL, XTI, and XLL at a low level and maintains the signal XNL at a high level. At the high level, the signal has such a size that the p channel MOSFET is turned off and the n channel MOSFET is turned on. For example, the signal at the high level has the power-supply voltage VDD. At the low level, the signal has such a size that the p channel MOSFET is turned on and the n channel MOSFET is turned off. For example, the signal has ground voltage VSS.

With the signals XPL, XTI, and XLL at the low level and the signal XNL at the high level, the transistors TP4 and TN4 are turned on, and the transistors TP1 and TN1, and TN5 are turned off. In FIG. 6 and subsequent figures, the transistor that is turned on is surrounded by a dashed line. Due to this state of the transistors, the node LAT is separated from both of the data bus DBUS and the data bus XBUS. On the other hand, the cross-connected inverter circuit XIV is connected to the power-supply voltage node VDD and the ground voltage node VSS, and can retain voltages of the nodes LAT and INV. That is, the node LAT maintains a voltage at a high or low level depending on digital data that is retained by the data latch circuit DLC. The node INV maintains a voltage at the level opposite to the level of the digital data that is retained by the data latch circuit DLC.

In addition, the non-selected data latch circuit DLC in the non-selected data latch circuit row LR and the non-selected data latch circuit column LC remains in a state that is illustrated in FIG. 6 while the selected data latch circuit DLC operates.

1.2.2 Input of Data from the Data Bus XBUS

At a point in time at which input of data from the data bus XBUS is started, the data latch circuit DLC is in a state in FIG. 6.

As illustrated in FIG. 7, while data is input from the data bus XBUS, the control circuit 14 maintains the signal XTI at the low level and maintains the transistor TN5 in an OFF state. For this reason, the node LAT is separated from the DBUS.

The control circuit 14 asserts the signal XNL at the low level and asserts the signal XPL at the high level. Accordingly, both of the transistors TP1 and TN1 are in an ON state, and thus the node LAT is connected to the data bus XBUS. Moreover, the transistors TP1 and TN1 are also turned in the non-selected data latch circuits DLC in the selected data latch circuit column LC. That is, one data latch circuit column LC is selected. In this way, through selection of a pair of the signals XNL and XPL for one data latch circuit column LC, one data latch circuit column LC is selected. That is, the nodes LAT are connected to the corresponding data buses XBUS, respectively. On the other hand, the signals XNL and XPL at the high level and at the low level, respectively, are supplied to the non-selected data latch circuit column LC, and thus each of such transistors TP1 and TN1 is turned off.

Furthermore, in the selected data latch circuit DLC, with the signal XNL at the low level, the transistor TN4 is turned off.

Additionally, the control circuit 14 sets a voltage of the signal XLL to a voltage Vweak, which falls between the low level (the voltage VSS) and the high level (the voltage VDD). The voltage Vweak has such a quantity that the p channel MOSFET is caused to operate in a linear area and thus the transistor TP4 is not completely turned on and is weakly turned on. This control is based on the following reasons.

The selected data latch circuit row LR includes the non-selected data latch circuit DLC as well. Among the data latch circuits DLC, data is input only into the selected data latch circuit DLC, and the non-selected data latch circuit DLC needs to be able to maintain data that is retained. For the input of the data, there is a need to prevent the cross-connected inverter circuit XIV from being able to retain data. That is, there is a need to prevent the cross-connected inverter circuit XIV from being able to maintain a voltage of the node LAT (and the node INV). In order to do this, it is preferable that the circuit XIV is separated from both of the power-supply voltage node VDD and the ground voltage node VSS. Furthermore, voltages from the power-supply voltage node VDD and the ground voltage node VSS should not be able to prevent the setting of a voltage of the node LAT in accordance with at least data that is input. In order to do this, it is preferable that the transistor TP4 is turned off with the signal XLL at the high level. On the other hand, it is desirable that the voltage VDD is supplied to a cross-connected inverter circuit IVC of the non-selected data latch circuit DLC in order to maintain data. In order to do this, it is desirable that the transistor TP4 is turned on and thus it is desirable that the signal XLL is at the low level.

Nevertheless, each signal XLL is shared by the data latch circuit row LR. Because of this, in one data latch circuit row LR, the signal XLL at the high level can be supplied to a gate of a certain transistor TP4 and the signal XLL at the low level cannot be supplied to a gate of a different transistor TP4. Accordingly, as described above, the signal XLL has such a size that the transistor TP4 is weak but is not turned on. Specifically, in the non-selected data latch circuit DLC, the voltage Vweak has a level such that a voltage from the power-supply voltage VDD is supplied to the cross-connected inverter circuit XIV and thus the circuit XIV is able to continue to retain data. In the selected data latch circuit DLC, the voltage Vweak has a level that supply of a voltage to the node LAT through the transistors TP4 and TN4 does not prevent setting of a voltage of the node LAT in accordance with the data that is input. More specifically, the voltage Vweak is, for example, 0.4 V. With the signal XLL having this quantity of the voltage Vweak, in the selected data latch circuit row LR, the selected data latch circuit DLC correctly takes in the data from the data bus XBUS and the non-selected data latch circuit DLC maintains data that is retained.

In the non-selected data latch circuit row LR, the node LAT in the selected data latch circuit column LC is connected to the data bus XBUS by the transistors TP1 and the TN1 that are turned on. However, with supply of a voltage of the power-supply voltage node VDD through the transistor TP4 that is turned on, the selected data latch circuit DLC in the non-selected data latch circuit row LR maintains the voltage of the node LAT.

The control circuit 14 performs an operation in FIG. 7 on a plurality of (for example all) data latch circuits DLC in the selected data latch circuit column LC, and thus can concurrently input data into the data latch circuit DLC.

After the data is input from the data bus XBUS, the control circuit 14 sets the selected data latch circuit DLC to be in the state in FIG. 6.

1.2.3. Output of Data to the Data Bus XBUS

At a point in time at which output of data to the data bus XBUS is started, the selected data latch circuit DLC is in the state in FIG. 6.

When the output of the data to the data bus XBUS is started, the control circuit 14 sets the signal XPC of the transistor TP11 to be at the low level to pre-charge the data bus XBUS to the high level, and then returns the signal XPC to the high level.

While the data is output, as illustrated in FIG. 8, the control circuit 14 maintains the signal XNL at the high level, and maintains the signal XLL at the low level. For this reason, the transistors TP4 and TN4 remain turned on, and thus, as in the state in FIG. 6, the node LAT maintains a voltage in accordance with data that has to be retained. Furthermore, the control circuit 14 maintains the signal XTI at the low level and maintains the transistor TN5 in the OFF state. For this reason, the node LAT is separated from the data bus DBUS.

Next, the control circuit 14 sets the signal XPL to be changed from the low level to the high level. With this signal transition, the transistor TN1 is turned on, and the node LAT and the data bus XBUS are connected to each other. As a result, if the voltage of the node LAT is at the high level, a voltage of the data bus XBUS remains at the high level, and thus, data at the high level is transferred from the data latch circuit DLC to the data bus XBUS. On the other hand, if the voltage of the node LAT is at the low level, the voltage of the data bus XBUS is decreased to the low level, and thus data at the low level is transferred from the data latch circuit DLC to the data bus XBUS.

On the other hand, in the non-selected data latch circuit column LC, with the signals XNL and XPL at the high level and at the low level, respectively, the nodes LAT are not connected to the data buses XBUS, respectively, and thus data is not output.

The control circuit 14 performs an operation in FIG. 8 on the plurality of (for example all) data latch circuits DLC in the selected data latch circuit column LC, and thus can concurrently output data from the data latch circuit DLC.

After the data is output to the data bus XBUS, the control circuit 14 sets the data latch circuit DLC to be in the state in FIG. 6.

1.2.4 Input of the Data from the Data Bus DBUS

At the point in time at which the input of the data from the data bus DBUS is started, the data latch circuit DLC is in the state in FIG. 6. Furthermore, at the point in time at which the input of the data from the data bus DBUS is started, the data bus DBUS already has a voltage that is based on data that has to be transferred to the data latch circuit DLC. That is, the control circuit 14 sets the signal DPC to be at the low level, pre-charges the data bus DBUS to the high level, and then returns the signal DPC to the high level. Next, the latch circuit (for example, the latch circuit within the sense amplifier 17, which is connected to the data bus DBUS) that retains data which has to be transferred is connected to the data bus DBUS. As a result, if the data that has to be transferred is at the high level, a voltage of the data bus DBUS remains at the high level, and on the other hand, if the data that has to be transferred is at the low level, the voltage of the data bus DBUS is changed to the low level.

As illustrated in FIG. 9, while the data is input from the data bus DBUS, the control circuit 14 maintains the signal XPL at the low level and maintains the transistor TN1 in the OFF state. Furthermore, as described above, the transistor TP1 is turned off. For this reason, the node LAT continues to be separated from the data bus XBUS.

Furthermore, the control circuit 14 maintains the signal XNL at the high level, and maintains the signal XLL at the high level. For this reason, the transistor TN4 remains turned on, and the transistor TP4 is turned off. Accordingly, the cross-connected inverter circuit XIV is separated from the power-supply voltage node VDD, and is prevented from being able to maintain the voltage of the node LAT. For this reason, it is possible that the voltage of the node LAT is changed by the voltage of the data bus DBUS.

The control circuit 14 sets the signal XTI to be at the high level. As a result, the transistor TN5 is turned on, and thus the node LAT is connected to the data bus DBUS. Moreover, any other non-selected data latch circuit DLC in the selected data latch circuit row LR, the transistor TN5 is also turned on. That is, one data latch circuit row LR is selected. In this way, through selection of the signal XTI for one data latch circuit row LR, one data latch circuit row LR is selected. That is, the nodes LAT are connected to the corresponding data buses DBUS, respectively. On the other hand, the signal XTI at the low level is supplied to the non-selected data latch circuit row LR, and thus each of the transistors TN5 is turned off.

In the selected data latch circuit DLC, the node LAT is connected to the data bus DBUS, and thus the level of the node LAT is the same as the level of the data bus DBUS. That is, if the voltage of the data bus DBUS is at the high level, the voltage of the node LAT is at the high level. In this way, data at the high level of the data bus DBUS is transferred to the data latch circuit DLC. On the other hand, if the voltage of the data bus DBUS is at the low level, the voltage of the node LAT is at the low level. In this way, a voltage at the low level of the data bus DBUS is transferred to the data latch circuit DLC.

On the other hand, in the non-selected data latch circuit row LR, with the signal XTI at the low level, the nodes LAT are not connected to the data buses DBUS, respectively, and thus do not receive data.

The control circuit 14 performs an operation in FIG. 9 on the plurality of (for example all) data latch circuits DLC in the selected data latch circuit row LR, and thus can concurrently input data into the data latch circuit DLC.

After the data is input from the data bus DBUS, the control circuit 14 sets the data latch circuit DLC to be in the state in FIG. 6.

1.2.5 Output of the Data to the Data Bus DBUS

At a point in time at which output of the data to the data bus DBUS is started, the selected data latch circuit DLC is in the state in FIG. 6.

When the output of the data to the data bus DBUS is started, the control circuit 14 sets the signal DPC of the transistor TP10 to be at the low level, pre-charges the data bus DBUS to the high level, and then returns the signal DPC to the high level.

While the data is output, as illustrated in FIG. 10, the control circuit 14 maintains the signal XNL at the high level, and maintains the signal XLL at the low level. For this reason, the transistors TP4 and TN4 remain turned on, and thus, as in the state in FIG. 6, the node LAT maintains the voltage in accordance with the data that has to be retained. With the signal XNL at the high level, the transistor TP1 remains turned off, and the control circuit 14 maintains the signal XPL at the low level and maintains the transistor TN1 in the OFF state. For this reason, the node LAT is separated from the data bus XBUS.

Next, the control circuit 14 changes the signal XTI from the low level to the high level. With this signal transition, the transistor TN5 is turned on, and the node LAT and the data bus DBUS are connected to each other. As a result, if the voltage of the node LAT is at the high level, the voltage of the data bus DBUS remains at the high level, and thus, the data at the high level is transferred from the data latch circuit DLC to the data bus DBUS. On the other hand, if the voltage of the node LAT is at the low level, the voltage of the data bus DBUS is decreased to the low level, and thus the data at the low level is transferred from the data latch circuit DLC to the data bus DBUS.

On the other hand, in the non-selected data latch circuit row LR, with the signal XTI at the low level, the nodes LAT are not connected to the data buses DBUS, respectively and thus do not output data.

The control circuit 14 performs an operation in FIG. 10 on the plurality of (for example all) data latch circuits DLC in the selected data latch circuit row LR, and thus can concurrently output data from the data latch circuit DLC.

After the data is output to the data bus DBUS, the control circuit 14 sets the data latch circuit DLC to be in the state in FIG. 6.

1.2.6 Waveform of the Signal XLL

Figure 11:
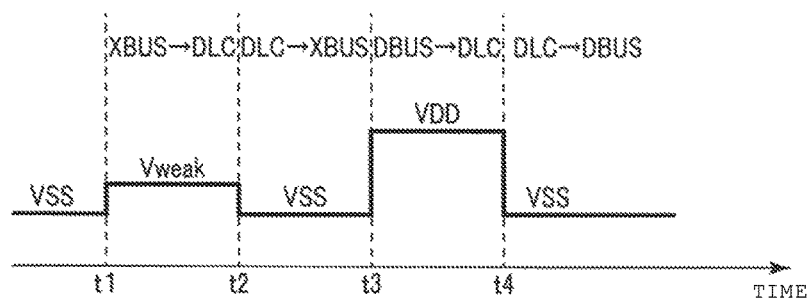
FIG. 11 is a diagram illustrating over time signal levels of a control signal for a transistor in the data latch circuit according to the first embodiment.

FIG. 11 illustrates a waveform of the voltage of the signal XLL over time between various operations by the selected data latch circuit DLC. FIG. 11, as an example, illustrates a waveform between each of the input of the data from the data bus XBUS, the output of the data to the data bus XBUS, the input of the data from the data bus DBUS, and the output of the data to the data bus DBUS in this order. That is, in FIG. 11, the waveform in FIG. 11 illustrates operations that relates to the data latch circuit DLC that receives the data from the data bus XBUS, outputs the data to the data bus XBUS, receives the data from the data bus DBUS, and outputs the data to the data bus DBUS.

Over a period from a time t1 to a time t2, the control circuit 14 inputs the data from the data bus XBUS that is connected to the selected data latch circuit DLC, into the selected data latch circuit DLC. In order to do this, over the period from the time t1 to the time t2, the control circuit 14 maintains the voltage of the signal XLL at the voltage Vweak.

Over a period from the time t2 to a time t3, the control circuit 14 outputs the data from the selected data latch circuit DLC to the data bus XBUS. In order to do this, the control circuit 14 maintains the voltage of the signal XLL at the voltage VSS over the period from the time in point t2 to the time t3. A waveform over the period from the time t2 to the time t3 is the same as a waveform that results while the data latch circuit DLC simply latches the data.

Over a period from the time t3 and a time t4, the control circuit 14 inputs the data from the data bus DBUS that is connected to the selected data latch circuit DLC, into the selected data latch circuit DLC. In order to do this, the control circuit 14 maintains the voltage of the signal XLL at the high level (the voltage VDD) over the period from the time t3 to the time t4.

From the time t4, the control circuit 14 outputs the data from the selected data latch circuit DLC to the data bus DBUS that is connected to the selected data latch circuit DLC. In order to do this, the control circuit 14 maintains the voltage of the signal XLL at the voltage VSS from the time t4. A waveform from the time t4 is the same as a waveform that results while the data latch circuit DLC simply latches data.

1.3 Advantages (Effects)

Figure 12:
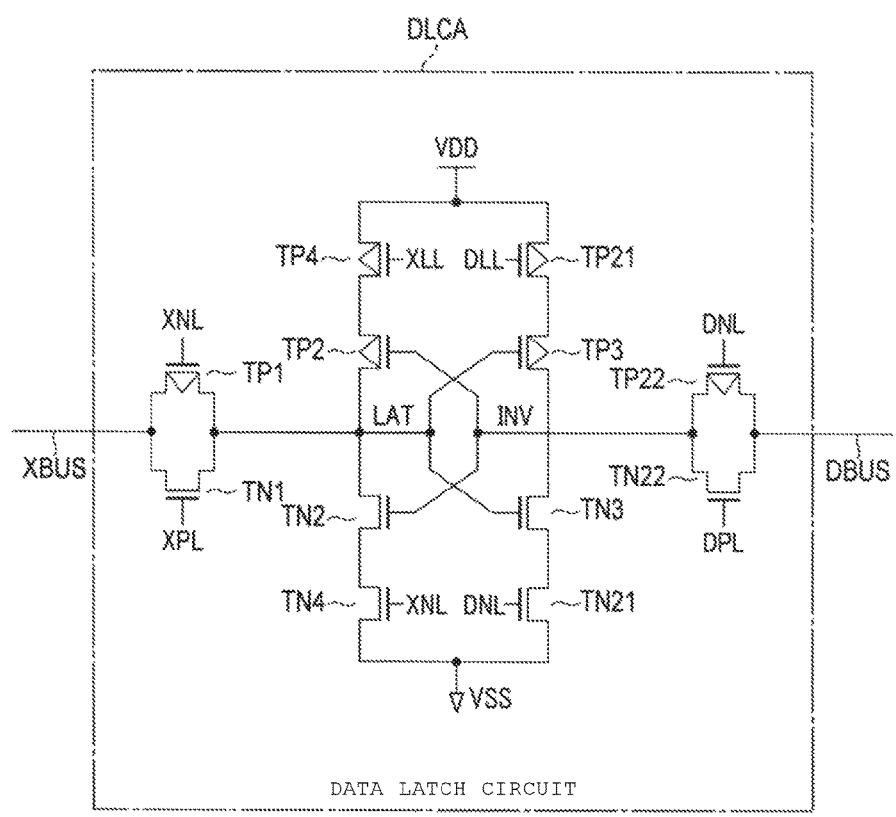
FIG. 12 is a circuit diagram of a conventional data latch circuit.

FIG. 12 illustrates elements of a data latch circuit DLCA and connections therebetween for comparison with the data latch circuit DLC according to the embodiment. As illustrated in FIG. 12, the data latch circuit DLCA includes transistors TP1, TP2, TP3, TP4, TN1, TN2, TN3, and TN4 that are connected to one another in such a manner that they are described with reference to FIG. 10. The data latch circuit DLCA further includes a p channel MOSFET TP21 between the transistor TP3 and the power-supply voltage node VDD, and an n channel MOSFET TN21 between the transistor TN3 and the ground voltage node VSS. The data latch circuit DLCA additionally includes a p channel MOSFET TP22 and an n channel MOSFET TN22 that are connected in parallel to each other between the node INV and one data bus DBUS.

The data latch circuit DLCA for comparison includes 12 transistors. On the other hand, the data latch circuit DLC according to the first embodiment includes 9 transistors. For this reason, according to the first embodiment, an area of the data latch circuit DLC is smaller than that of the data latch circuit DLCA. As is the case with the data latch circuits DLC, a significantly large number of the data latch circuits, each of which is connected between the data bus XBUS and the data bus DBUS, are present in the memory device 1. In the embodiment, 4,096 data latch circuits DLC are necessary. For this reason, although only three transistors per one data latch circuit DLC are no longer necessary, the total number of transistors that are no longer necessary across all data latches 19 is significantly large. As a result, an area of the data latch 19 is significantly smaller than an area of the data latch that includes the data latch circuits DLCA of which the number is the same as the number of the data latch circuits.

Although the data latch circuit DLC has a smaller number of transistors than the data latch circuits DLCA for comparison, the data latch circuit DLC performs retention, inputting, and outputting of data in the same manner as the data latch circuit DLCA. Specifically, as is described in Section 1.2. Operation, the data latch circuit DLC performs retention of data, inputting of data from the data bus XBUS, outputting of data to the data bus XBUS, inputting of data from the data bus DBUS, and outputting of data to data bus DBUS. Particularly, while the data is input from the data bus XBUS into the selected data latch circuit DLC, the voltage Vweak is applied to the signal XLL in the selected data latch circuit row LR. Accordingly, the non-selected data latch circuit DLC in the data latch circuit row LR can continue to retain data. Specifically, although a connection is weak, the cross-connected inverter circuit XIV of the non-selected data latch circuit DLC in the selected data latch circuit row LR is connected to the power-supply voltage node VDD, and can maintain data. On the other hand, the cross-connected inverter circuit XIV of the selected data latch circuit DLC in the selected data latch circuit row LR does not receive the ground voltage VSS, does not turn on the transistor TP4 completely, and thus is prevented from being able to retain data. Because of this, it is possible that the node LAT is set to the voltage of the data bus XBUS. That is, even in the case of the data latch circuit DLC that occupies a small area, a necessary operation can be performed.

Figure 13:
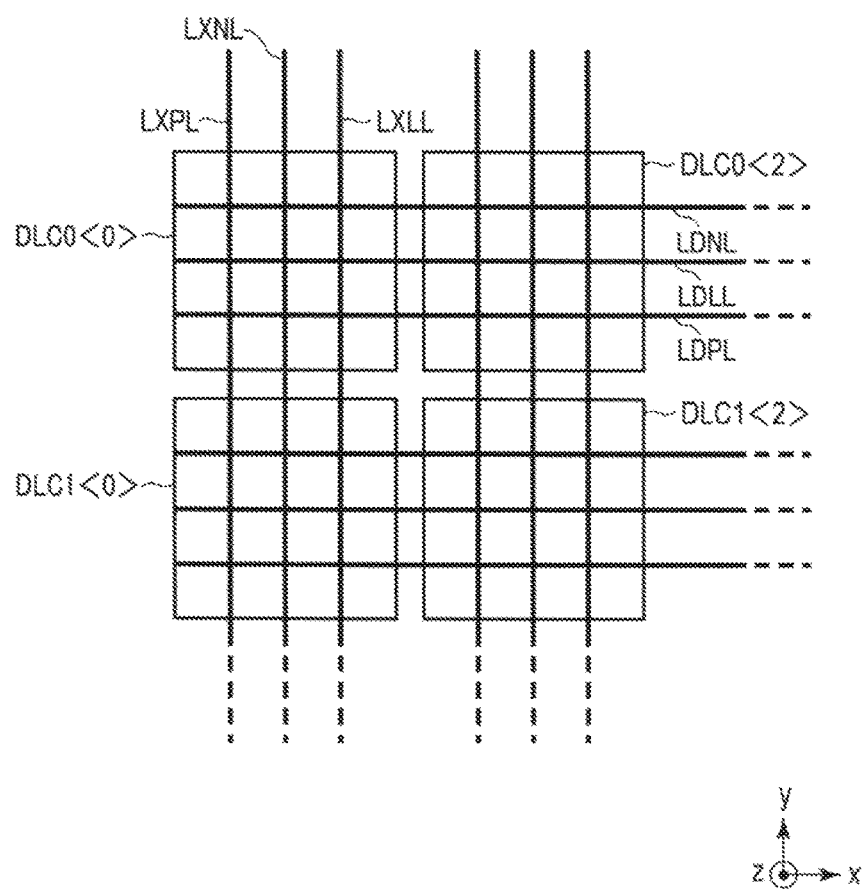
FIG. 13 is a diagram illustrating a conventional layout data latches and control signal wires for the data latches.

Furthermore, the number of transistors within the data latch circuit DLC is smaller than the number of transistors within the data latch circuit DLCA for comparison. As a result, the number of wirings over which to transfer a signal for controlling the data latch circuit DLC is also smaller than the number of wirings over which to transfer a signal for controlling the data latch circuit DLCA for comparison. As illustrated in FIG. 13, due to the use of the data latch circuit DLCA, three wirings LDNL, LDDL, and LDPL along the x axis and three wirings LXPL, LXNL, and LXLL along the y axis are necessary for the control of the data latch circuit DLC. Signals DNL, DDL, DPL, XPL, NLL, and XLL are transferred over the wirings LDNL, LDLL, LDPL, LXPL, LXNL, and LXLL, respectively. Miniaturization of the memory device that includes the data latch circuit DLCA is accompanied by an arrangement of these wirings in a limited area, which is quite difficult.

According to the first embodiment, two wirings LXPL and LXNL along the x axis and two wirings LXTI and LXLL along the y axis are necessary for the control of each data latch circuit DLC. For this reason, the wiring is easier to install than in the case of the use of the data latch circuit DLCA for comparison, and although the memory device 1 is more miniaturized, it is possible that in the data latch 19, the wirings are arranged for the control of the data latch circuit DLC.

Second Embodiment

A second embodiment is different from the first embodiment in terms of details of the data latch circuit DLC.

2.1. Configuration (Structure)

Figure 14:
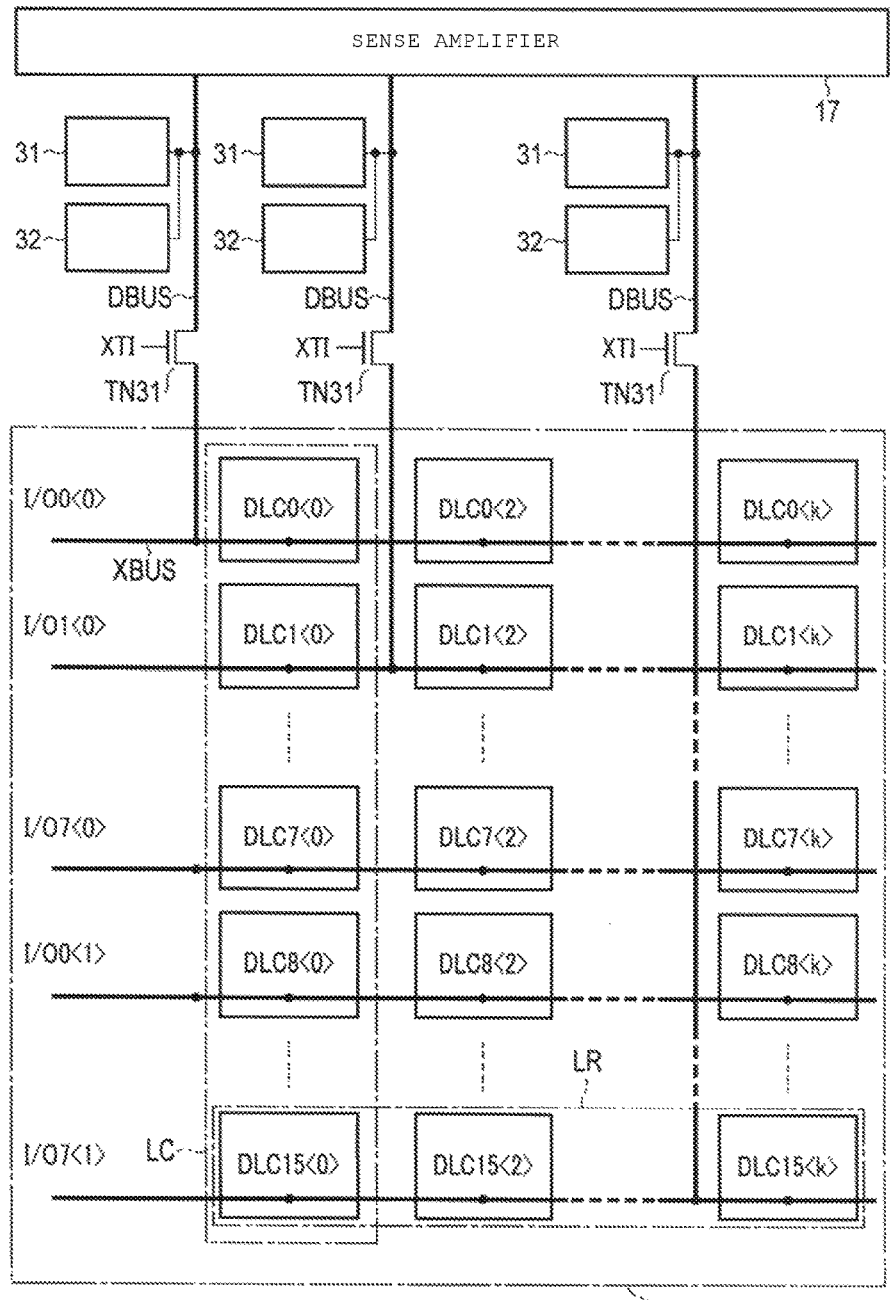
FIG. 14 is a diagram illustrating data latches employing a data latch circuit according to a second embodiment.

FIG. 14 illustrates elements of a data latch 19 according to the second embodiment and related connections therebetween. As illustrated in FIG. 14, according to the second embodiment, each data bus XBUS is connected to one data bus DBUS through an n channel MOSFET TN31 that functions as the switch circuit. Consequently, each data latch circuit row LR is connected to one data bus DBUS through the transistor TN31. Different transistors TN31 receive a signal XTI through their respective gate electrodes. Based on these connections of the elements according to the second embodiment, a data latch circuit DLC according to the second embodiment has different elements and connections from those according to the first embodiment.

Figure 15:
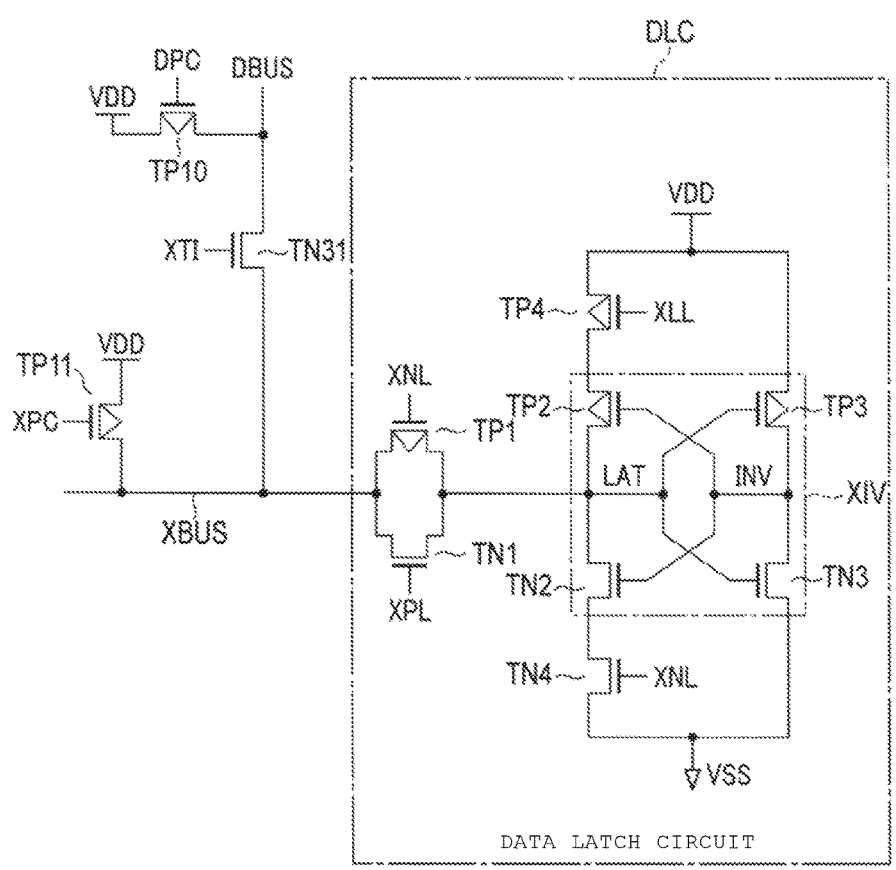
FIG. 15 is a circuit diagram of the data latch circuit according to the second embodiment.

FIG. 15 illustrates elements of the data latch circuit DLC according to the second embodiment and connections therebetween. The data latch circuits DLC all have the same element and the connection. As illustrated in FIG. 15, the data latch circuit DLC does not include the transistor TN5 according to the first embodiment (refer to FIG. 4).

Figure 16:
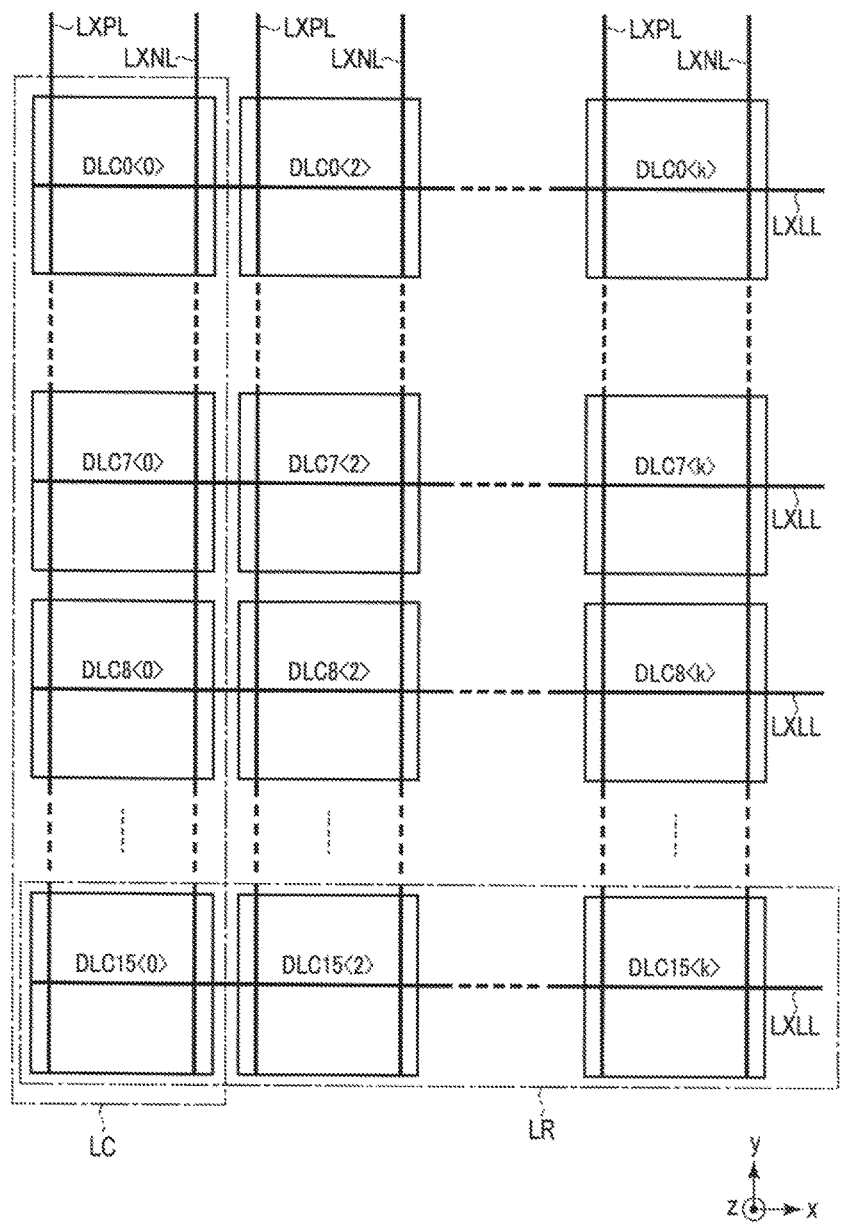
FIG. 16 is a diagram illustrating a layout of control signal wires for the data latch circuit according to the second embodiment.

Additionally, based on the elements of the data latch circuit DLC and the connections therebetween, which are illustrated in FIG. 15, an arrangement of wirings over which to transfer a signal for controlling the data latch circuit DLC is as illustrated in FIG. 16. FIG. 16 illustrates a layout of the data latch circuit DLC according to the second embodiment and an arrangement of wirings over which to transfer a signal for controlling the data latch circuit DLC. As illustrated in FIG. 16, in the data latch circuit row LR, the wiring LXLL is provided and the wiring LXTI is not in contrast to the first embodiment.

2.2 Operation

The retention of data, the inputting of data from the data bus XBUS, and the outputting of data to the data bus XBUS are the same as those according to the first embodiment, except that the transistor TN31 performs the same operation as the transistor TN5. That is, while the data is retained, the control circuit 14 maintains the transistors TP1, TN1, and TN31 in the OFF state, and maintains the transistors TP4 and TN4 in the ON state. Accordingly, the cross-connected inverter circuit XIV is connected to the power-supply voltage node VDD and the ground voltage node VSS, retains the voltage of the node LAT, and is not connected to both of the data bus XBUS and DBUS in the node LAT.

While the data is input from the data bus XBUS, the control circuit 14 maintains the transistors TP1 and TN1 in the ON state, maintains the transistors TN4 and TN31 in the OFF state, and turns on the transistor TP4 weakly (the voltage of the signal XLL is set to the voltage Vweak). Accordingly, in the selected data latch circuit row LR, the node LAT of the selected data latch circuit DLC is connected to the data bus XBUS through the transistors TP1 and TN1, and the node LAT is set to a voltage in accordance with data that has to be retained. On the other hand, in the selected data latch circuit row LR, the non-selected data latch circuit DLC maintains the voltage of the node LAT through supply of a voltage from the power-supply voltage node VDD through the transistor TP4 that is turned on weakly. With the supply of the voltage of the power-supply voltage node VDD through the transistor TP4 that is turned on, the selected data latch circuit DLC in the non-selected data latch circuit row LR maintains the voltage of the node LAT. As is the case with the first embodiment, the control circuit 14 can concurrently input data into the plurality of (for example, all) data latch circuits DLC in the selected data latch circuit column LC.

While the data is output to the data bus XBUS, the control circuit 14 maintains the transistors TP1 and TN31 in the OFF state, and maintains the transistors TN1, TN4, and TP4 in the ON state. Accordingly, the selected data latch circuit DLC maintains the voltage of the node LAT. The selected data latch circuit DLC maintains the voltage of the data bus XBUS at the high level if the voltage of the node LAT is at the high level, and lowers the voltage of the data bus XBUS to the low level if the voltage of the node LAT is at the low level. In the non-selected data latch circuit column LC, with the transistors TP1 and TN1 that are turned off, the nodes LAT are not connected to the data buses XBUS, respectively, and thus each piece of data is not output. As is the case with the first embodiment, the control circuit 14 can concurrently output data from the plurality of (for example, all) data latch circuits DLC in the selected data latch circuit column LC.

Figure 17:
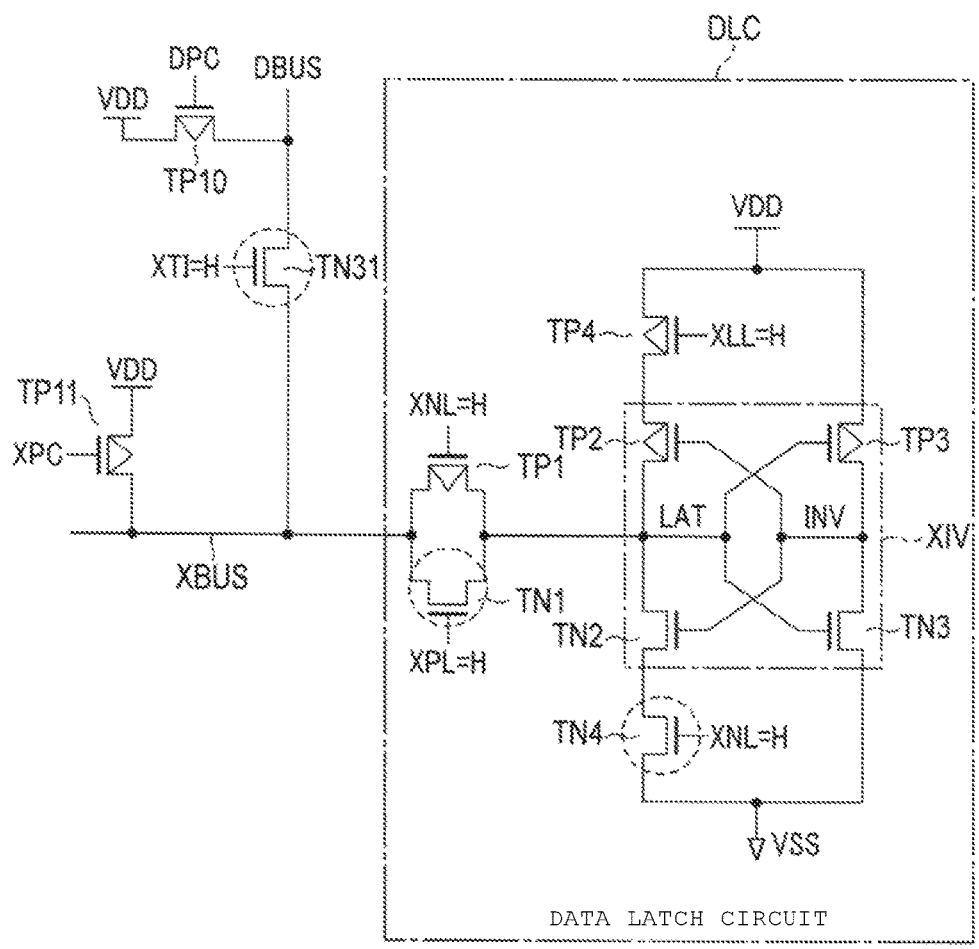
FIGS. 17-18 are circuit diagrams that illustrate different states of the data latch circuit according to the second embodiment during operation.

FIG. 17 illustrates a state that results while data is input from the data bus DBUS to the selected data latch circuit DLC. The data bus DBUS goes through the operation that is described according to the first embodiment, and already has a voltage in accordance with data that is transferred to the data latch circuit DLC.

The control circuit 14 sets the signal XTI to be at the high level, and turns on the transistor TN31 that is connected to the data bus XBUS in the selected data latch circuit row LR. Furthermore, the control circuit 14 sets the signal XLL to be at the high level, turns off the transistor TP4, and thus prevents the cross-connected inverter circuit XIV from being able to retain the voltage of the node LAT. The transistor TN4 remains turned on.

The control circuit 14 sets the signal XPL to be at the high level. Accordingly, the node LAT is connected to the data bus DBUS through the transistors TN1 and TN31, and is set to the voltage of the data that has to be retained.

With the transistor TN31 that is connected and is turned off, the non-selected data latch circuit row LR is not connected to each of the data buses DBUS, and the voltage of each of the nodes LAT is maintained. With the transistors TP1 and TN1 that are turned off, the non-selected data latch circuit DLC in the selected data latch circuit row LR does not connect the nodes LAT to the data buses DBUS, respectively, and maintains the voltage of each of the nodes LAT.

As is the case with the first embodiment, the control circuit 14 performs an operation in FIG. 17 on the plurality of (for example all) data latch circuits DLC in the selected data latch circuit row LR, and thus can concurrently input data into the data latch circuit DLC.

Figure 18:
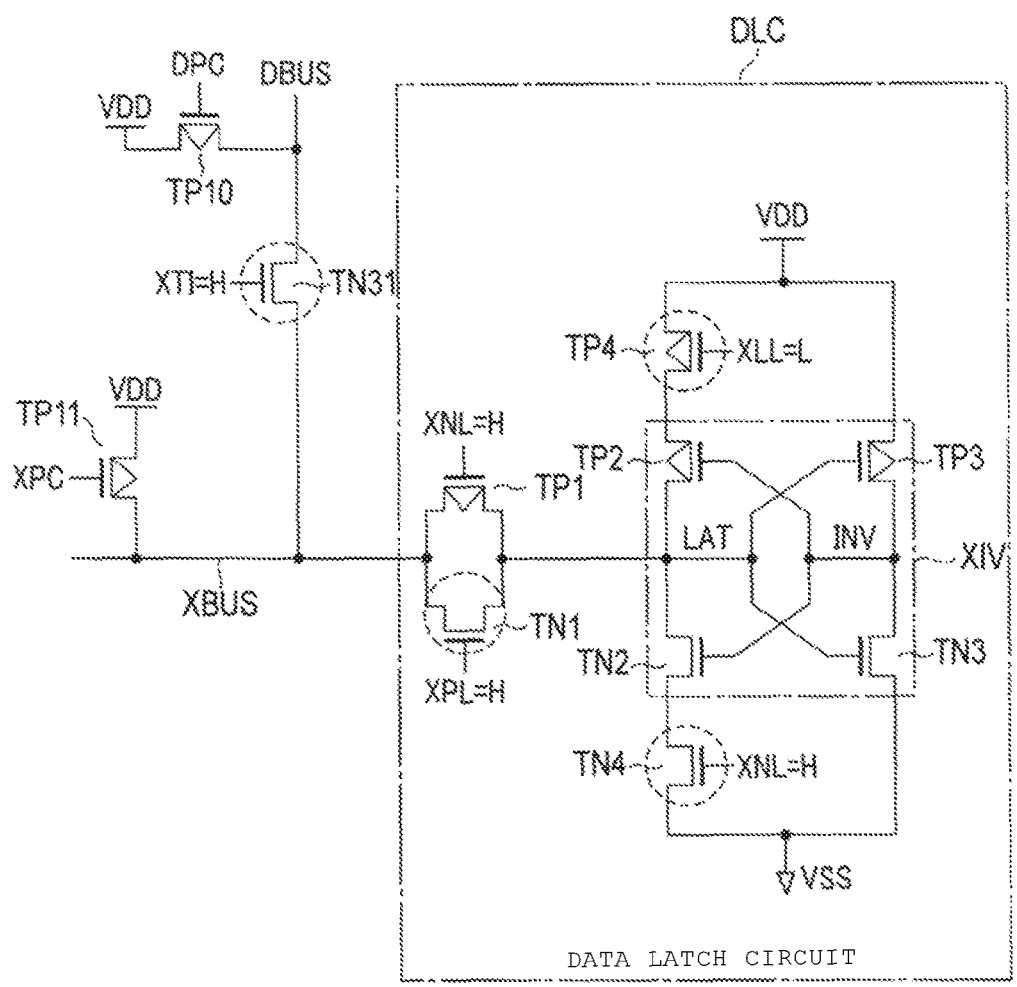

FIG. 18 illustrates a state that results while data is output from the selected data latch circuit DLC to the data bus DBUS. The data bus DBUS goes through the operation that is described according to the first embodiment, and is pre-charged to the high level.

The control circuit 14 maintains the signals XLL and XNL at the low level and at the high level, respectively, and maintains the transistors TP4 and TN4 in the ON state. The control circuit 14 sets the signal XTI to be at the high level and turns on the transistor TN31 that is connected to the selected data latch circuit row LR. The control circuit 14 sets the signal XPL to be at the high level, turns on the transistor TN1, and connects the node LAT to the data bus DBUS. Accordingly, the voltage of the data bus DBUS remains at the high level if the voltage of the node LAT is at the high level, and the voltage of the data bus DBUS is lowered to the low level if the voltage of the node LAT is at the low level.

In the non-selected data latch circuit column LC in the selected data latch circuit row LR, with the transistors TP1 and TN1 that are turned off, the nodes LAT are not connected to the data buses XBUS, respectively, and thus data is not output. In the selected data latch circuit column LC in the non-selected data latch circuit row LR, each of the transistors TN1 is turned on, but each of the transistors TN31 remains turned off. Thus, each piece of data is not output.

As is the case with the first embodiment, the control circuit 14 performs an operation in FIG. 18 on the plurality of (for example all) data latch circuits DLC in the selected data latch circuit row LR, and thus can concurrently output data from the data latch circuit DLC.

2.3 Advantage (Effect)

The data latch circuit DLC according to the second embodiment includes 8 transistors. For this reason, according to the second embodiment, an area of the data latch circuit DLC is smaller than that of the data latch circuit DLC according to the first embodiment. Furthermore, the data latch circuit DLC according to the second embodiment does not include the transistor TN5 according to the first embodiment, and thus in each data latch circuit row LR, the wiring LXTI according to the first embodiment is not provided and only the wiring LXLL is provided. Consequently, an arrangement of wirings for control of the data latch circuit DLC with the data latch 19 is easier than in the first embodiment, and even in the memory device 1 that is further miniaturized, the arrangement of the wirings for the control of the data latch circuits DLC is possible.

Each data latch circuit DLC according to the second embodiment, although it includes less transistors than the first embodiment, performs the retention of data and the inputting and outputting of data in the same manner as the data latch circuit DLCA. Specifically, the operation by the transistor TN5 according to the first embodiment, which is described in Section 2.2. Operation, is replaced with the operation by the transistor TN31, and thus the data latch circuit DLC performs the retention of data, the inputting of data from the data latch XBUS, and the outputting of data to the data bus XBUS.

In the inputting of data from the data bus DBUS, the control circuit 14 turns off the transistor TP4 of the selected data latch circuit DLC to prevent the selected data latch circuit DLCA from being able to retain the voltage of the node LAT, and connects the node LAT to the data bus DBUS through the transistors TN1 and TN31. Accordingly, the node LAT sets the voltage thereof to the voltage of the data that has to be retained. On the other hand, the non-selected data latch circuit row LR is not connected to each of the data buses DBUS, and the non-selected data latch circuit DLC in the selected data latch circuit row LR does not connect the nodes LAT to the data buses DBUS, respectively. In this way, data is input into the selected data latch circuit DLC, and data is not input into the non-selected data latch circuit DLC.

In the outputting of the data to the data bus DBUS, the control circuit 14 connects the node LAT of the selected data latch circuit DLC to the data bus DBUS through the transistors TN1 and TN31. Accordingly, the voltage of the node LAT is transferred to the data bus DBUS. On the other hand, in the non-selected data latch circuit column LC in the selected data latch circuit row LR, the node LAT is not connected to each of the data buses DBUS, and the selected data latch circuit column LC in the non-selected data latch circuit row LR is not connected to each of the data buses DBUS. In this way, the selected data latch circuit DLC outputs data, and the non-selected data latch circuit DLC does not output data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data latch circuit comprising:
   a first inverter circuit having a first input terminal and a first output terminal, and connected between a first voltage source and a second voltage source;
   a second inverter circuit having a second input terminal electrically connected to the first output terminal and a second output terminal electrically connected to the first input terminal, and connected between the first voltage source and the second voltage source;
   a first p-type transistor electrically connected between the first voltage source and the first inverter circuit;
   a first n-type transistor electrically connected between the second voltage source and the first inverter circuit;
   a first switch circuit that controls an electrical connection between the first output terminal and a first bus, the first switch circuit including a second p-type transistor and a second n-type transistor connected in parallel between the first output terminal and the first bus; and
   a second switch circuit that controls an electrical connection between the first output terminal and a second bus, wherein
   the first n-type transistor and the second p-type transistor are controlled with a common control signal.

2. The circuit according to claim 1, wherein the second inverter circuit is electrically connected to each of the first and second voltage sources without any intervening transistors.

3. The circuit according to claim 1, wherein the first voltage source is a power supply terminal and the second voltage source is a ground terminal.

4. The circuit according to claim 1, wherein the second switch circuit includes one and only one transistor electrically connected between the first output terminal and the second bus.

5. The circuit according to claim 1, wherein the first output terminal is electrically connected to each of the first and second switch circuits without any intervening transistors.

6. The circuit according to claim 1, wherein a total number of transistors is no more than 9.

7. The circuit according to claim 1, further comprising:
   a signal line connected to a plurality of data latch circuits arranged in a substantially a same direction as a direction of the second bus.

8. The circuit according to claim 1, wherein a voltage of a signal controlling the first p-type transistor is set to:
   a voltage between a voltage of the first voltage source and a voltage of the second voltage source when the first output terminal is connected to the first bus, and
   the voltage of the first voltage source when the first output terminal and the second bus.

9. The circuit according to claim 1, wherein
   the first bus is connected to an input and output circuit, and
   the second bus is connected to a sense amplifier.

10. The circuit according to claim 1, wherein
    the data latch circuit is connected to a first signal line, a second signal line, a third signal line, and a fourth signal line, and
    the first and second switch circuits are controlled with signals received via the first, second, third, and fourth signal lines.

11. The circuit according to claim 10, wherein the first and second signal lines extend in a first direction and the third and fourth signal lines extend in a second direction crossing the first direction.

12. The circuit according to claim 11, wherein first direction is substantially a same direction along which the first bus extends and that the second direction is substantially a same direction along which the second bus extends.

13. The circuit according to claim 12, wherein
    the first signal line is connected to the first n-type transistor and the second p-type transistor,
    the second signal line is connected to the second n-type transistor
    the third signal line is connected to the first p-type transistor, and
    the fourth signal line is connected to the second switch circuit.

14. A data latch circuit comprising:
    a first inverter circuit having a first input terminal and a first output terminal, and connected between a first voltage source and a second voltage source;
    a second inverter circuit having a second input terminal electrically connected to the first output terminal and a second output terminal electrically connected to the first input terminal, and connected between the first voltage source and the second voltage source;
    a first p-type transistor electrically connected between the first voltage source and the first inverter circuit;
    a first n-type transistor electrically connected between the second voltage source and the first inverter circuit; and
    a switch circuit that controls an electrical connection between the first output terminal and a bus, the switch circuit including a second p-type transistor and a second n-type transistor connected in parallel between the first output terminal and the bus, wherein
    the first n-type transistor and the second p-type transistor are controlled with a common control signal, and
    the second inverter circuit is electrically connected to each of the first and second voltage sources without any intervening transistors.

15. The circuit according to claim 14, wherein a total number of transistors is no more than 9.

16. The circuit according to claim 14, further comprising:
    a signal line connected to a plurality of data latch circuits arranged in a substantially a same direction as a direction of another bus.

17. The circuit according to claim 14, wherein a voltage of a signal controlling the first p-type transistor is set to:
    a voltage between a voltage of the first voltage source and a voltage of the second voltage source when the first output terminal is connected to the bus, and
    the voltage of the first voltage source when the first output terminal and another bus.

18. The circuit according to claim 14, wherein
the first bus is connected to an input and output circuit, and
the second bus is connected to a sense amplifier.

19. The circuit according to claim 14, wherein
the latch circuit is connected to a first signal line, a second signal line, a third signal line, and a fourth signal line, and
the first and second switch circuits are controlled with signals received via the first, second, third, and fourth signal lines.

20. The circuit according to claim 19, wherein the first and second signal lines extend in a first direction and the third and fourth signal lines extend in a second direction crossing the first direction.

21. The circuit according to claim 20, wherein first direction is substantially a same direction along which the first bus extends and that the second direction is substantially a same direction along which the second bus extends.

22. The circuit according to claim 21, wherein
the first signal line is connected to the first n-type transistor and the second p-type transistor,
the second signal line is connected to the second n-type transistor
the third signal line is connected to the first p-type transistor, and
the fourth signal line is connected to the second switch circuit.

* * * * *